(12) United States Patent  
Matsuura

(10) Patent No.: US 12,412,795 B2  
(45) Date of Patent: Sep. 9, 2025

(54) DUAL DOWN-SET CONDUCTIVE TERMINALS FOR EXTERNALLY MOUNTED PASSIVE COMPONENTS

(71) Applicant: TEXAS INSTRUMENTS INCORPORATED, Dallas, TX (US)

(72) Inventor: Masamitsu Matsuura, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 440 days.

(21) Appl. No.: 18/090,273

(22) Filed: Dec. 28, 2022

(65) Prior Publication Data

US 2024/0222212 A1 Jul. 4, 2024

(51) Int. Cl.
*H01L 23/31* (2006.01)
*H01L 21/56* (2006.01)
(Continued)

(52) U.S. Cl.
CPC ........ *H01L 23/3114* (2013.01); *H01L 21/565* (2013.01); *H01L 24/48* (2013.01); *H01L 25/50* (2013.01); *H01L 2224/48247* (2013.01)

(58) Field of Classification Search
CPC ... H01L 23/3114; H01L 21/565; H01L 24/48; H01L 25/50; H01L 2224/48247
See application file for complete search history.

(56) References Cited

U.S. PATENT DOCUMENTS 5,814,884 A * 9/1998 Davis ................ H01L 23/49575
257/E23.044
8,106,491 B2 * 1/2012 Corisis .............. H01L 23/49541
438/109

(Continued)

Primary Examiner — Thao P Le
(74) Attorney, Agent, or Firm — Dawn Jos; Frank D. Cimino

(57) ABSTRACT

In some examples, a semiconductor package comprises a first die pad having a first top surface and a first bottom surface opposing the first top surface and a second die pad in horizontal alignment with the first die pad, the second die pad having a second top surface and a second bottom surface opposing the second top surface, a gap separating the first and second die pads. The package comprises a semiconductor die electrically coupled to the first and second bottom surfaces and extending across the gap, the semiconductor die having a device side including circuitry formed therein, the device side facing away from the first and second die pads. The package comprises a first conductive terminal extending from a lateral surface of the first die pad and away from the first die pad, the first conductive terminal having multiple down-sets. The package comprises a second conductive terminal extending from a lateral surface of the second die pad and away from the second die pad, the second conductive terminal having multiple down-sets. The package comprises a third conductive terminal having fewer down-sets than the first and second conductive terminals and extending from below the first die pad and away from the first die pad. The package comprises a bond wire coupling the device side of the semiconductor die to the third conductive terminal. The package comprises a mold compound covering the semiconductor die and the bond wire, the first and second die pads exposed to an exterior of the mold compound through a top surface of the mold compound. The package comprises a passive electrical component external to the mold compound and having a first electrical contact coupled to the first die pad and having a second electrical contact coupled to the second die pad. The first, second, and third conductive terminals include distal ends that are exposed through a common side surface of the mold compound, the distal ends in horizontal alignment with each other.

22 Claims, 37 Drawing Sheets

(51) Int. Cl.
*H01L 23/00* (2006.01)
*H01L 25/00* (2006.01)

(56) References Cited

U.S. PATENT DOCUMENTS

| | | | |
|---|---|---|---|
| 11,848,256 B2* | 12/2023 | Talledo | H01L 24/48 |
| 12,021,019 B2* | 6/2024 | Poddar | H05K 1/0204 |
| 12,136,588 B2* | 11/2024 | Kim | H01L 23/4334 |
| 2008/0217753 A1* | 9/2008 | Otani | H01L 23/3128 |
| | | | 438/126 |
| 2017/0338179 A1* | 11/2017 | Thadesar | H01L 24/49 |
| 2024/0222212 A1* | 7/2024 | Matsuura | H01L 24/48 |

* cited by examiner

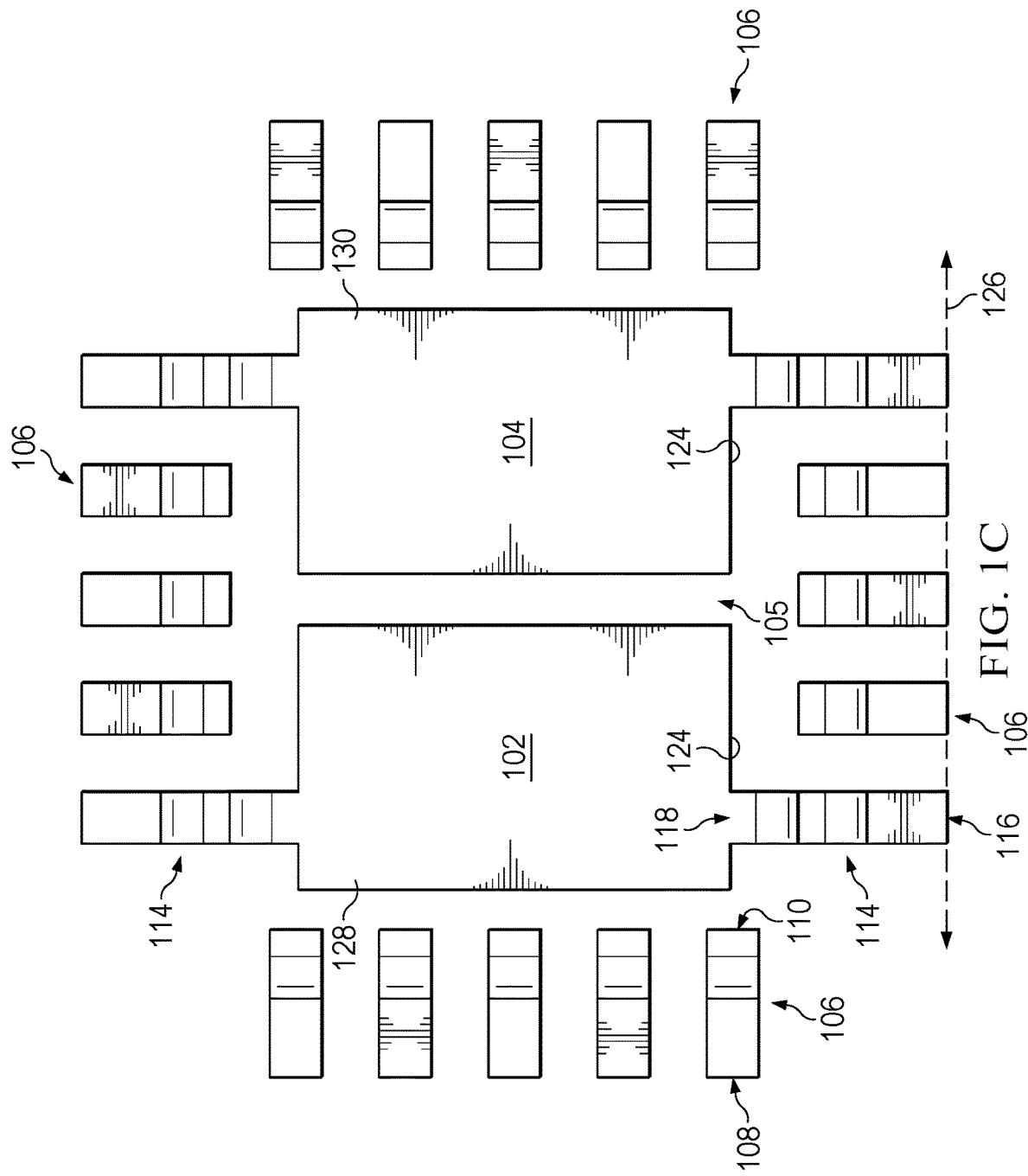

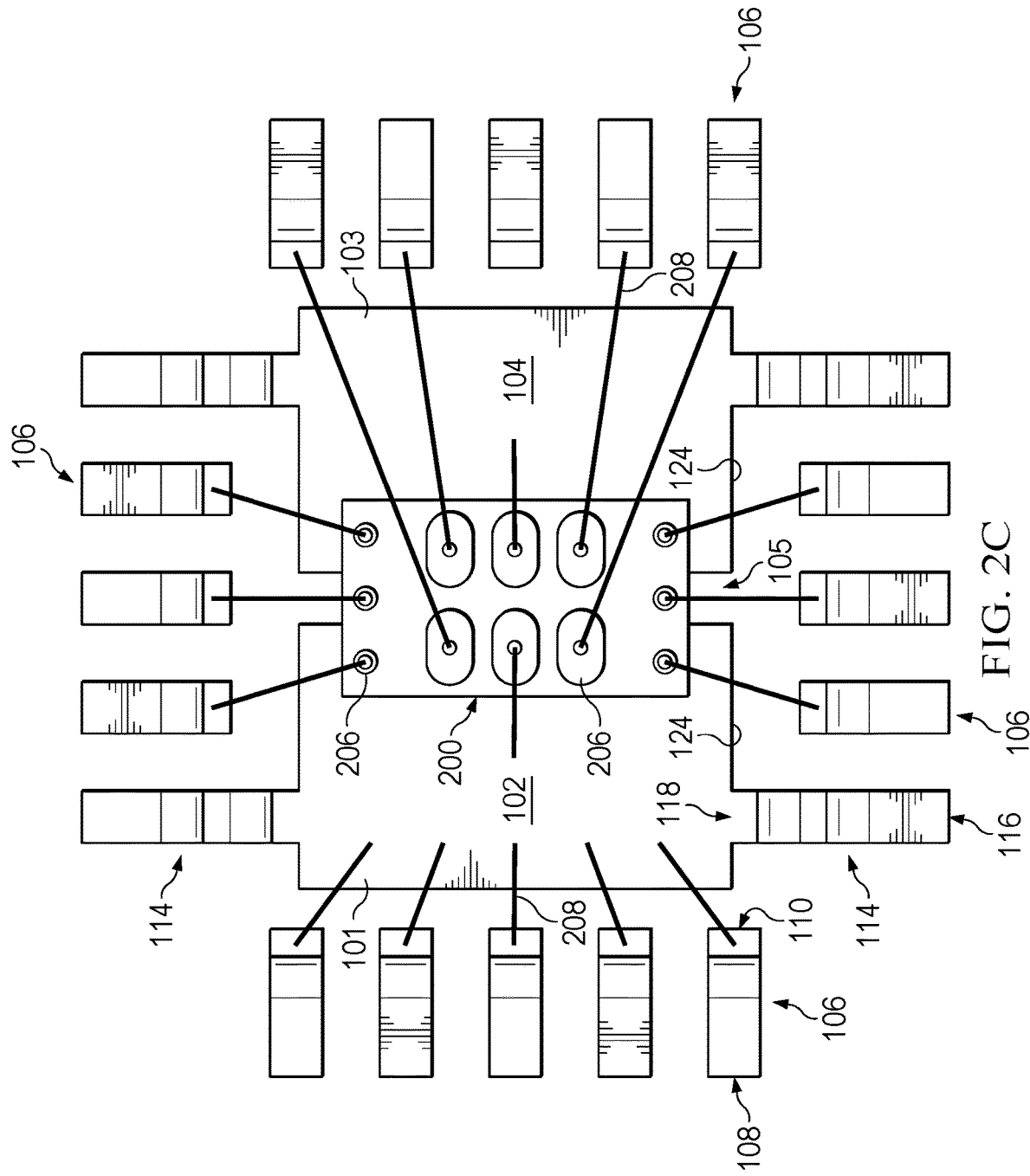

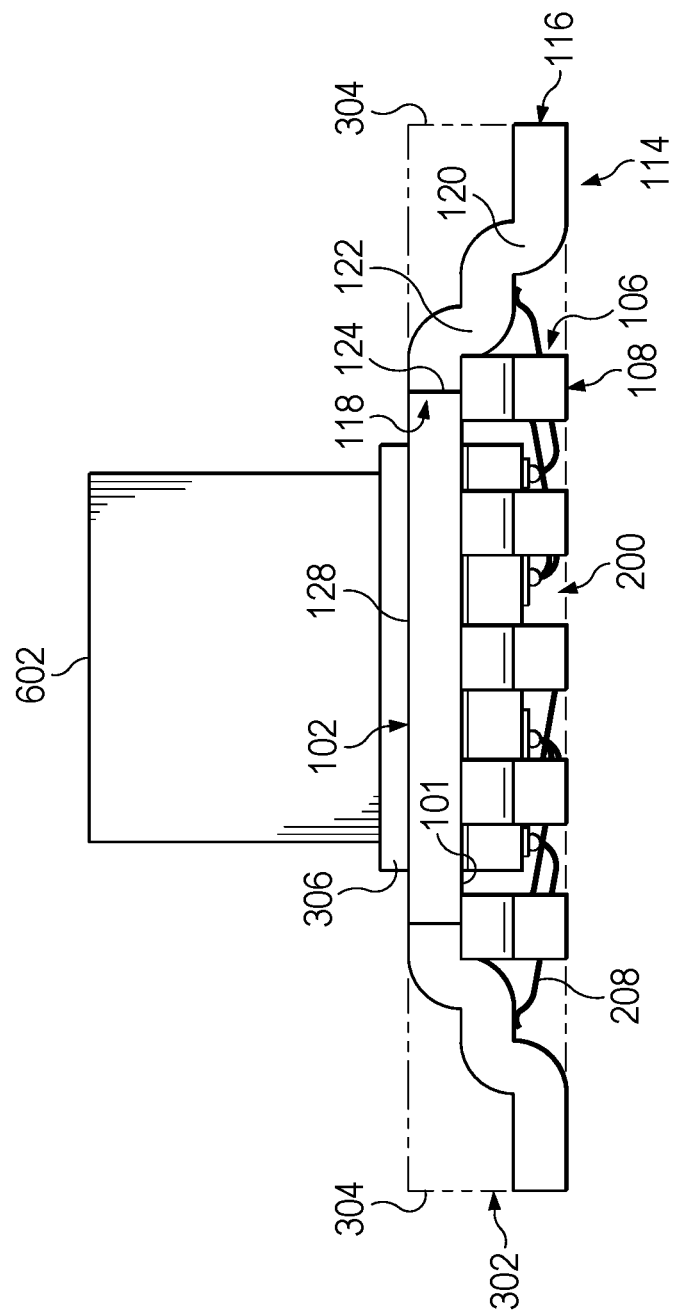

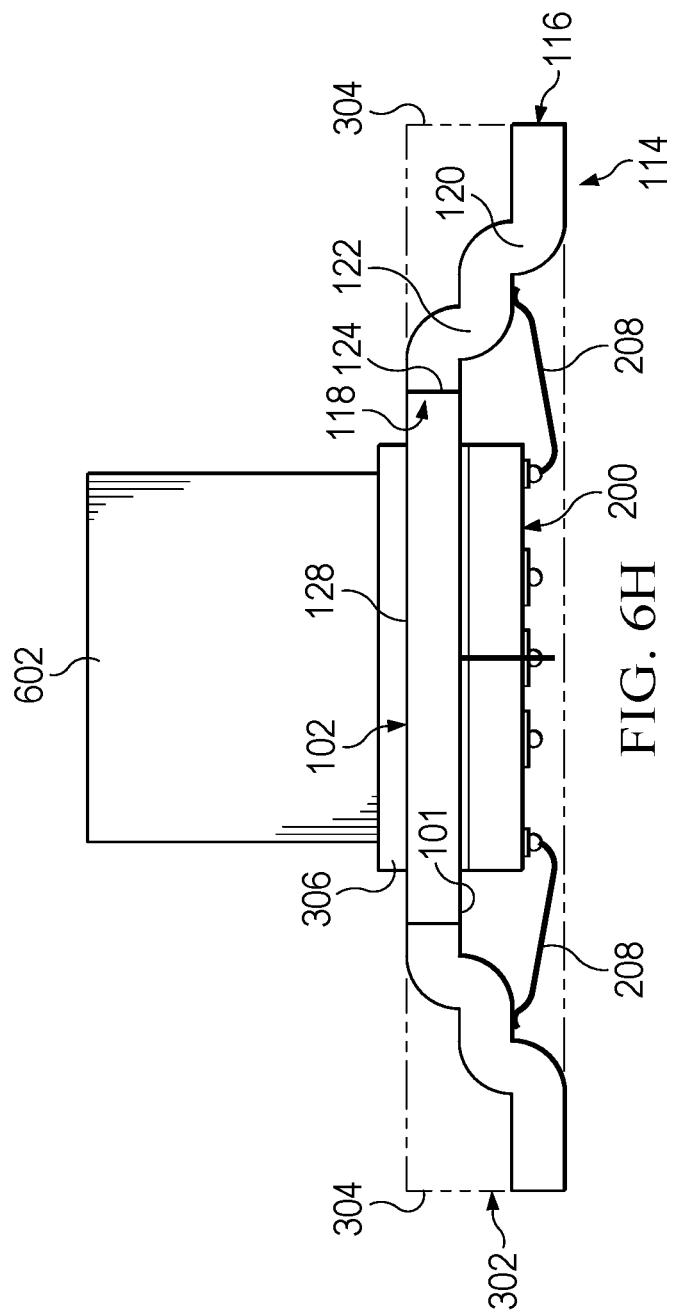

DUAL DOWN-SET CONDUCTIVE TERMINALS FOR EXTERNALLY MOUNTED PASSIVE COMPONENTS

BACKGROUND

A semiconductor package may include a semiconductor die and a mold compound to cover the semiconductor die. The package may further include conductive terminals exposed to an exterior surface of the housing. The conductive terminals are coupled to the semiconductor die. The conductive terminals provide electrical pathways between circuitry on the semiconductor die and components (e.g., printed circuit boards) outside of the package.

SUMMARY

In some examples, a semiconductor package comprises a first die pad having a first top surface and a first bottom surface opposing the first top surface and a second die pad in horizontal alignment with the first die pad, the second die pad having a second top surface and a second bottom surface opposing the second top surface, a gap separating the first and second die pads. The package comprises a semiconductor die electrically coupled to the first and second bottom surfaces and extending across the gap, the semiconductor die having a device side including circuitry formed therein, the device side facing away from the first and second die pads. The package comprises a first conductive terminal extending from a lateral surface of the first die pad and away from the first die pad, the first conductive terminal having multiple down-sets. The package comprises a second conductive terminal extending from a lateral surface of the second die pad and away from the second die pad, the second conductive terminal having multiple down-sets. The package comprises a third conductive terminal having fewer down-sets than the first and second conductive terminals and extending from below the first die pad and away from the first die pad. The package comprises a bond wire coupling the device side of the semiconductor die to the third conductive terminal. The package comprises a mold compound covering the semiconductor die and the bond wire, the first and second die pads exposed to an exterior of the mold compound through a top surface of the mold compound. The package comprises a passive electrical component external to the mold compound and having a first electrical contact coupled to the first die pad and having a second electrical contact coupled to the second die pad. The first, second, and third conductive terminals include distal ends that are exposed through a common side surface of the mold compound, the distal ends in horizontal alignment with each other.

In some examples, a method for manufacturing a semiconductor package comprises providing a metal structure including first and second die pads in horizontal alignment and separated by a gap, a first conductive terminal having a first end, and a second conductive terminal having a first end, the first end of the first conductive terminal extending closer to the first die pad in both the horizontal and vertical directions than does the first end of the second conductive terminal. The method also comprises coupling a semiconductor die to a bottom surface of the first die pad, wire-bonding the semiconductor die to the metal structure, and covering the metal structure and the semiconductor die with a mold compound such that top surfaces of the first and second die pads are exposed through a top surface of the mold compound. The method also comprises cutting the mold compound and the metal structure such that second ends of the first and second conductive terminals are exposed through a side surface of the mold compound that is orthogonal to the top surface of the mold compound, the second ends of the first and second conductive terminals are horizontally aligned with each other and are vertically lower than the first and second die pads.

BRIEF DESCRIPTION OF THE DRAWINGS

FIG. 1C is a top-down view of die pads and dual down-set conductive terminals for a semiconductor package in accordance with various examples.

FIG. 2C is a bottom-up view of a semiconductor die coupled to die pads and to dual down-set conductive terminals, in accordance with various examples.

FIG. 6D is a profile view of a semiconductor package having dual down-set conductive terminals and an externally mounted passive component, in accordance with various examples.

FIG. 6H is a profile view of a semiconductor package having dual down-set conductive terminals and an externally mounted passive component, in accordance with various examples.

DETAILED DESCRIPTION

Figure 1A:
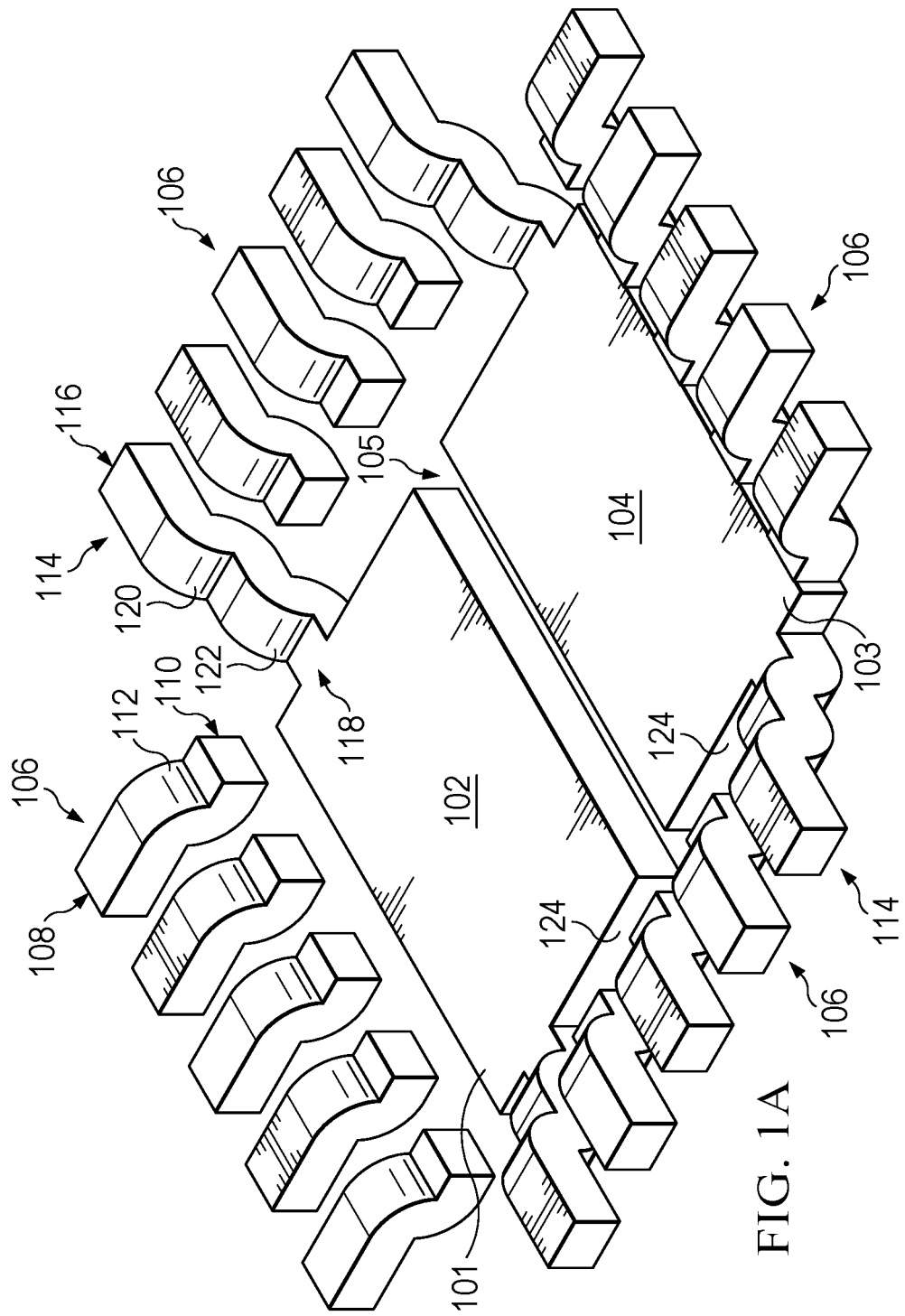
FIG. 1A is a perspective bottom view of die pads and dual down-set conductive terminals for a semiconductor package in accordance with various examples.

Space within a semiconductor package is valuable. Many different components may compete for space within the package. Industry pressure favors continual reductions in package sizes, thus reducing the amount of available space even further. To conserve space within the package, some components may be relocated outside of the package. For example, passive components may be coupled to a top surface of a package. Such passive components may communicate with the semiconductor die within the package through metal interconnects that are exposed through the top surface of the package and that are coupled to the semiconductor die.

Some types of packages, such as quad flat no lead (QFN) type packages, are relatively inexpensive to manufacture, but they are not as small as other, more expensive types of packages. A technique to reduce QFN package size—such as by relocating passive components to outside the package—without resorting to more expensive package types would be especially valuable, because such a technique would achieve smaller sizes comparable to those of more expensive packages without the increase in costs that accompanies such packages.

This disclosure describes various examples of a QFN type semiconductor package that resolves the challenges described above. In examples, the semiconductor package comprises a first die pad having a first top surface and a first bottom surface opposing the first top surface and a second die pad in horizontal alignment with the first die pad. The second die pad has a second top surface and a second bottom surface opposing the second top surface. A gap separates the first and second die pads. The package also includes a semiconductor die coupled to the first and second bottom surfaces and extending across the gap. The semiconductor die has a device side including circuitry formed therein, with the device side facing away from the first and second die pads. The package further comprises a first conductive terminal extending from a lateral surface of the first die pad and away from the first die pad, the first conductive terminal having multiple down-sets. The package also includes a second conductive terminal extending from a lateral surface of the second die pad and away from the second die pad, the second conductive terminal having multiple down-sets. The package further comprises a third conductive terminal having a single down-set and extending from below the first die pad and away from the first die pad. The package includes a bond wire coupling the device side of the semiconductor die to the third conductive terminal. The package also includes a mold compound covering the semiconductor die and the bond wire, the first and second die pads exposed to an exterior of the mold compound through a top surface of the mold compound. The package comprises a passive electrical component external to the mold compound and having a first electrical contact coupled to the first die pad and having a second electrical contact coupled to the second die pad. The first, second, and third conductive terminals include distal ends that are exposed through a common side surface of the mold compound. The distal ends in horizontal alignment with each other. This structure provides a technical solution to the technical problem of reducing QFN package size by relocating package components to a top surface of the package.

FIGS. 1A-6D are a process flow for manufacturing a semiconductor package having dual down-set conductive terminals and an externally mounted passive component, in accordance with various examples. FIG. 7 is a flow diagram of a method 700 for manufacturing a semiconductor package having dual down-set conductive terminals and an externally mounted passive component, in accordance with various examples. Accordingly, the method 700 of FIG. 7 is described in parallel with the structures and process flow of FIGS. 1A-6D.

The method 700 begins with providing a metal structure including first and second die pads in horizontal alignment and separated by a gap (702). A first conductive terminal has a first end, and a second conductive terminal has a first end (702). The first end of the first conductive terminal extends closer to the first die pad in both the horizontal and vertical directions than does the first end of the second conductive terminal (702). FIG. 1A is a perspective bottom view of die pads and dual down-set conductive terminals for a semiconductor package in accordance with various examples. Specifically, FIG. 1A shows a die pad 102 and a die pad 104. The die pads 102, 104, as well as the remaining components shown in FIG. 1A, comprise any suitable conductive material, such as a metal (e.g., copper) or an alloy. The die pads 102, 104 are horizontally aligned with each other, meaning that the die pads 102, 104 at least partially overlap with each other in the horizontal direction. For example, bottom surfaces 101, 103 of the die pads 102, 104 may be flush with each other. A gap 105 separates the die pads 102 and 104 from each other. The gap 105 ranges from 50 microns to 2000 microns, with a smaller gap being disadvantageous because a mold compound, when applied, will form voids, and with a larger gap being disadvantageous because of an unnecessary increase in package size. FIG. 1A also shows multiple conductive terminals 106. Each conductive terminal 106 has a distal end 108 and a proximal end 110. The ends 108 are distal to the die pads 102, 104, and the ends 110 are proximal to the die pads 102, 104. Each of the conductive terminals 106 includes a single down-set 112. A down-set is a segment of a conductive terminal that extends vertically to couple first and second segments of the conductive terminal that are different horizontal distances from the die pads 102, 104. Although a down-set may extend vertically, it may also simultaneously extend both horizontally and vertically, as shown in FIG. 1A. The proximal ends 110 do not couple to the die pads 102, 104. Rather, the proximal ends 110 are horizontally and vertically offset from the lateral surfaces 124 of the die pads 102, 104, as described further below.

FIG. 1A also shows multiple conductive terminals 114. Each conductive terminal 114 has a distal end 116 and a proximal end 118. The ends 116 are distal to the die pads 102, 104, and the ends 118 are proximal to the die pads 102, 104. Each of the conductive terminals 114 includes multiple down-sets 120, 122. The down set 120 is closer to the distal end 116, and the down set 122 is closer to the proximal end 118. Each of the proximal ends 118 is coupled to a lateral surface 124 of a die pad 102, 104. In some examples, the die pad 102 and the conductive terminals 114 to which it couples form a monolithic structure, meaning that the conductive terminals 114 and the die pad 102 are part of the same whole, rather than the conductive terminals 114 being formed separately and then being coupled to the die pad 102. Similarly, in some examples, the die pad 104 and the conductive terminals 114 to which it couples form a monolithic structure, meaning that the conductive terminals 114 and the die pad 104 are part of the same whole, rather than the conductive terminals 114 being formed separately and then being coupled to the die pad 104. However, for the sake of convenience, the conductive terminals 114 may be described herein as being coupled to the die pads 102, 104. Accordingly, the proximal ends 118 are closer to the lateral surfaces 124 of the die pads 102 than the proximal ends 110, and thus the proximal ends 118 are closer both horizontally and vertically to the lateral surfaces 124 than the proximal ends 110.

In some examples, each of the conductive terminals 106 has a single down-set (e.g., down-set 112), and each of the conductive terminals 114 has dual down-sets (e.g., down-sets 120, 122). In some examples, each of the conductive terminals 106 has fewer down-sets than does each of the conductive terminals 114 (e.g., each of the conductive terminals has x down-sets, and each of the conductive terminals 106 has y down-sets, where y<x). In some examples, each of the conductive terminals 106 has the same number of down-sets as does each of the conductive terminals 114, but at least one of the down-sets of the conductive terminals 114 extends farther in the vertical and horizontal directions than do the down-sets of the conductive terminals 106.

Figure 1B:
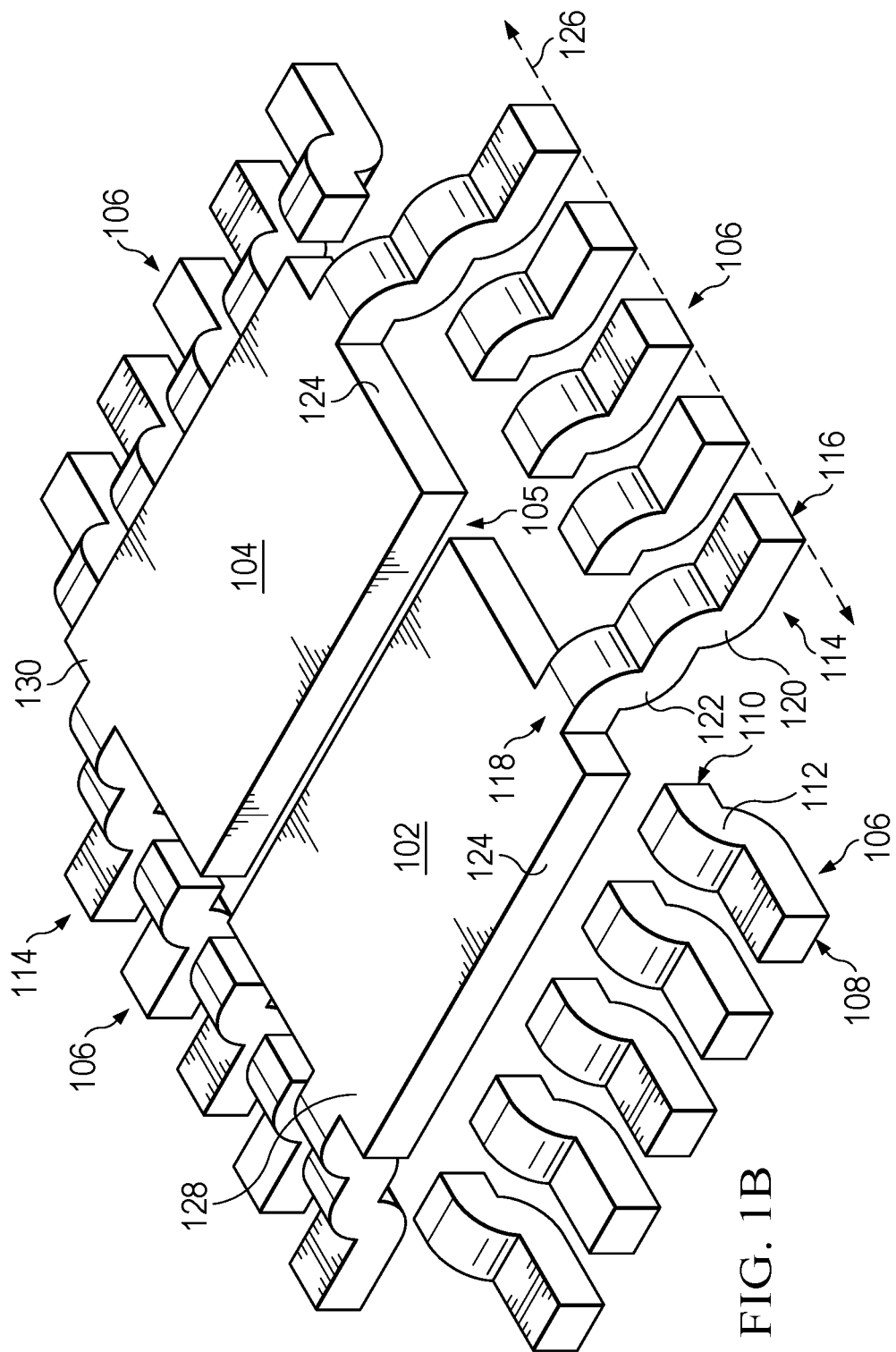
FIG. 1B is a perspective top-down view of die pads and dual down-set conductive terminals for a semiconductor package in accordance with various examples.

FIG. 1B is a perspective top-down view of the die pads 102, 104 and the conductive terminals 106, 114 in accordance with various examples. The die pads 102, 104 have top surfaces 128, 130, respectively. Further, the distal ends 108, 116 of the conductive terminals 106, 114 are vertically lower than the die pads 102, 104, and as numeral 126 indicates, the distal ends 108, 116 of the conductive terminals 106, 114 are in horizontal alignment with each other.

Figure 1D:
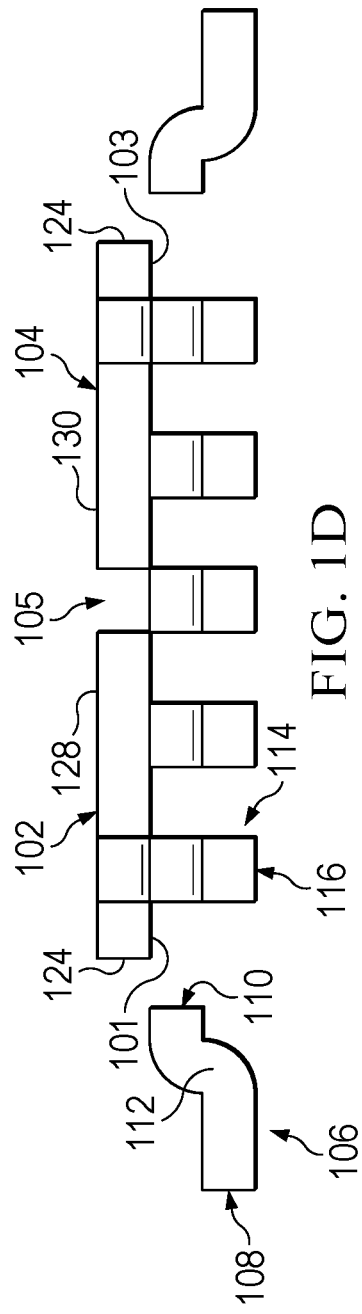
FIG. 1D is a profile view of die pads and dual down-set conductive terminals for a semiconductor package in accordance with various examples.
Figure 1E:
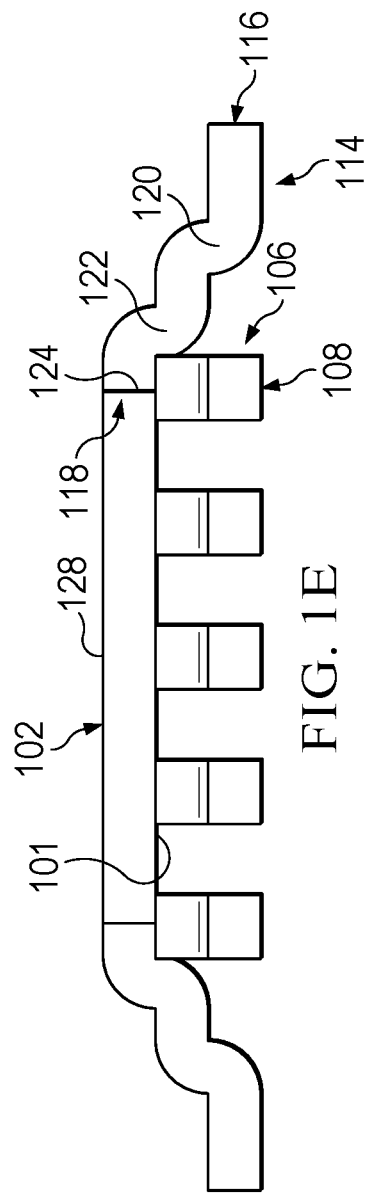
FIG. 1E is a profile view of die pads and dual down-set conductive terminals for a semiconductor package in accordance with various examples.
Figure 1F:
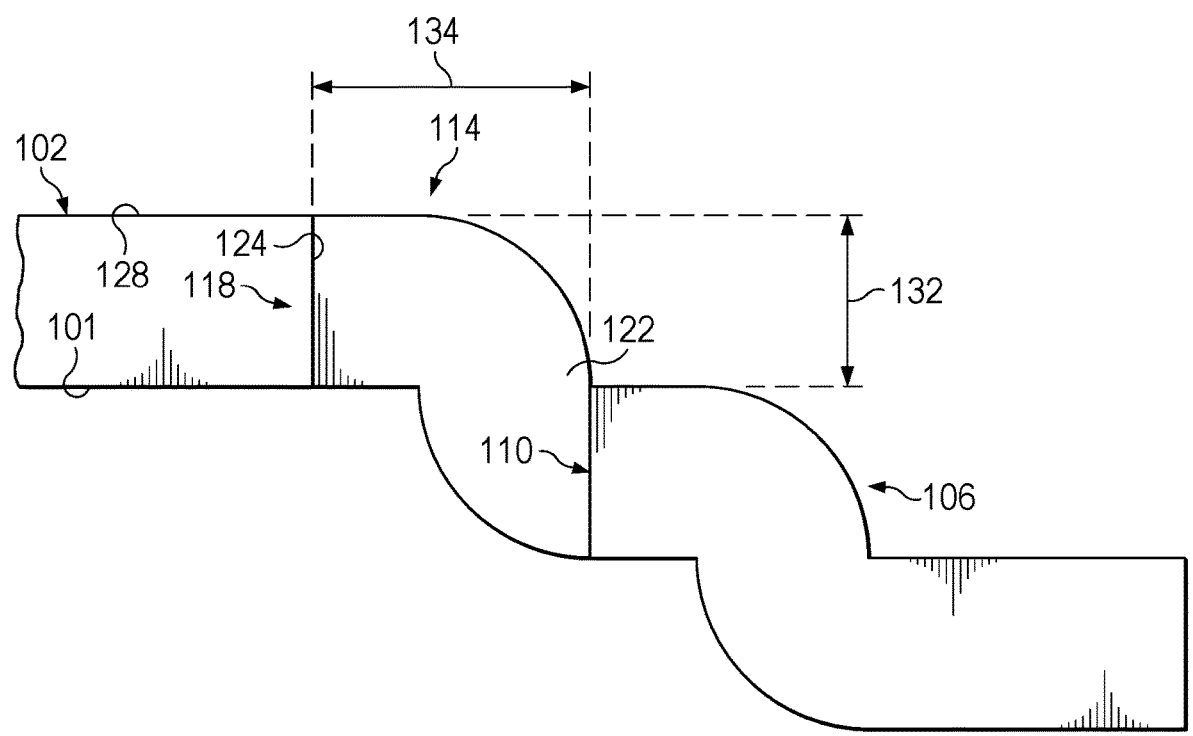
FIG. 1F is a profile view of a die pad and dual down-set conductive terminals for a semiconductor package in accordance with various examples.

FIG. 1C is a top-down view of the die pads 102, 104 and the conductive terminals 106, 114, in accordance with various examples. FIG. 1D is a profile view of the die pads 102, 104 and the conductive terminals 106, 114, in accordance with various examples. FIG. 1E is a profile view of the die pads 102, 104 and the conductive terminals 106, 114, in accordance with various examples. FIG. 1F is a close-up, profile view of the die pad 102 and the conductive terminals 106, 114, in accordance with various examples. As shown, a vertical line represents the meeting of the proximal end 118 and the lateral surface 124, but as explained above, the conductive terminal 114 and the die pad 102 may be part of the same whole, e.g., a monolithic structure. The proximal end 110 is vertically farther (e.g., lower) from the lateral surface 124 than the proximal end 118. Further, a gap 134 shows that the proximal end 110 is horizontally farther (e.g., more distal) from the lateral surface 124 than is the proximal end 118. Stated another way, the proximal end 110 is not in horizontal alignment with the die pad 102 or the lateral surface 124, and the proximal end 110 is not in vertical alignment with the die pad 102 or the lateral surface 124. Vertical alignment means that two components at least partially overlap with each other in the vertical direction. The distance 132 shows the offset between the top surfaces of the conductive terminals 106, 114 and has a range of 50 microns to 1000 microns, with a smaller distance being disadvantageous because of mold compound voiding challenges and mold compound cracking, and with a larger distance being disadvantageous because it presents significant lead frame manufacturing challenges. The gap 134 has a range of 50 microns to 2000 microns, with a smaller gap being disadvantageous because of mold compound voiding challenges, and with a larger gap being disadvantageous because it results in bond wire sweeps due to long bond wire loops and larger package sizes.

Figure 2A:
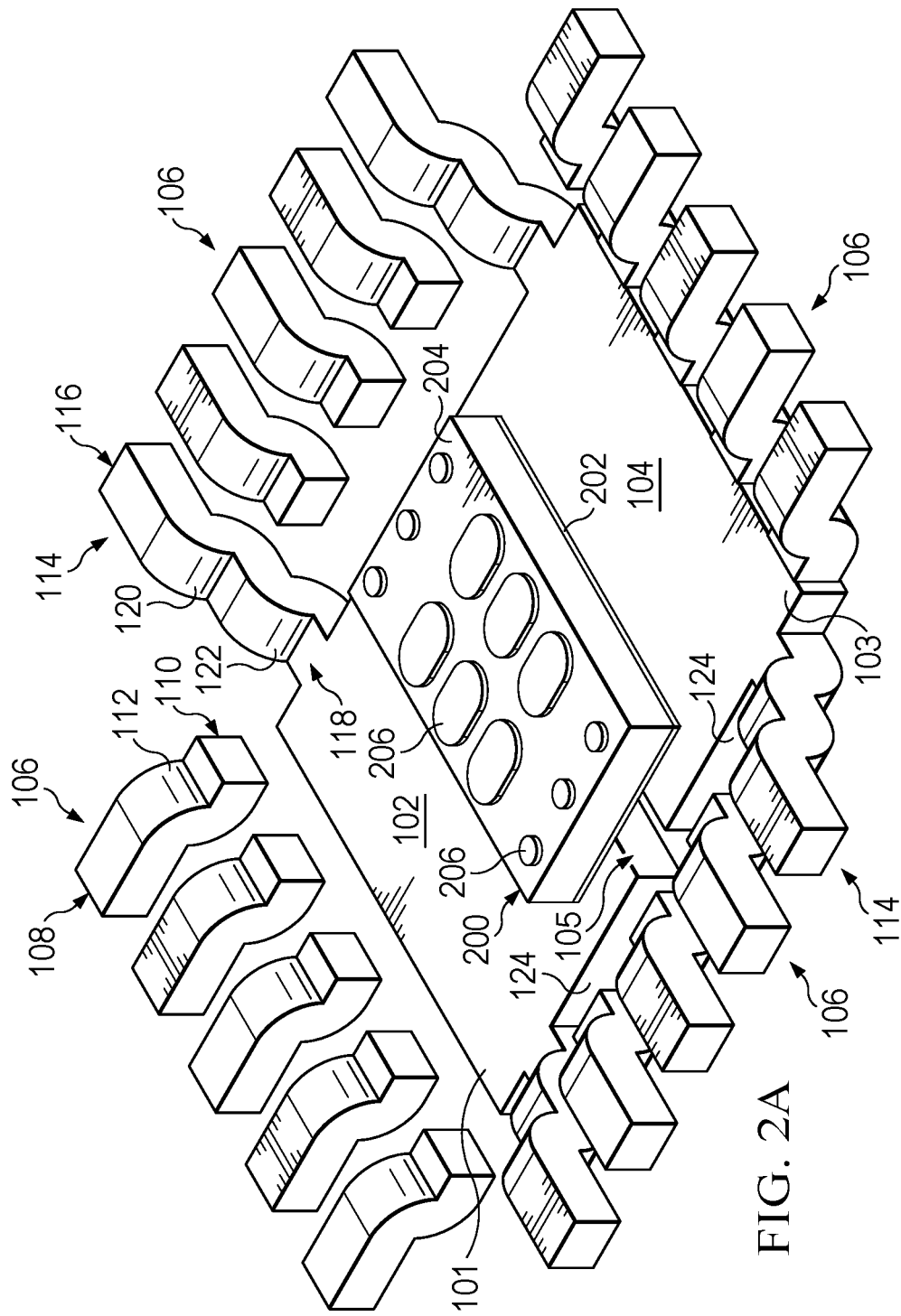
FIG. 2A is a perspective bottom view of dual down-set conductive terminals and of a semiconductor die coupled to die pads, in accordance with various examples.

The method 700 includes coupling a semiconductor die to a bottom surface of the first die pad (704). FIG. 2A is a perspective bottom view of the conductive terminals 106, 114 and of a semiconductor die coupled to the die pads 102, 104, in accordance with various examples. Specifically, FIG. 2A shows a semiconductor die 200 coupled to the die pads 102, 104. In examples, the semiconductor die 200 is coupled to the bottom surfaces 101, 103. The semiconductor die 200 may be coupled to the bottom surfaces 101, 103 using a die attach layer 202. Alternatively, the semiconductor die 200 may be coupled to the bottom surfaces 101, 103 using a suitable paste. In examples, because the semiconductor die 200 is coupled to the bottom surfaces 101 and 103, the semiconductor die 200 spans the gap 105 and is partially visible from a top-down view of the structure of FIG. 2A. The die attach layer 202, if used, likewise spans the gap 105. The semiconductor die 200 has a device side 204 in which circuitry is formed. The device side 204 faces away from the die pads 102, 104. Bond pads 206 are formed on the device side 204. The bond pads 206 form interfaces at which bond wires or other suitable connectors may be coupled to form electrical pathways with the circuit formed on the device side 204.

Figure 2B:
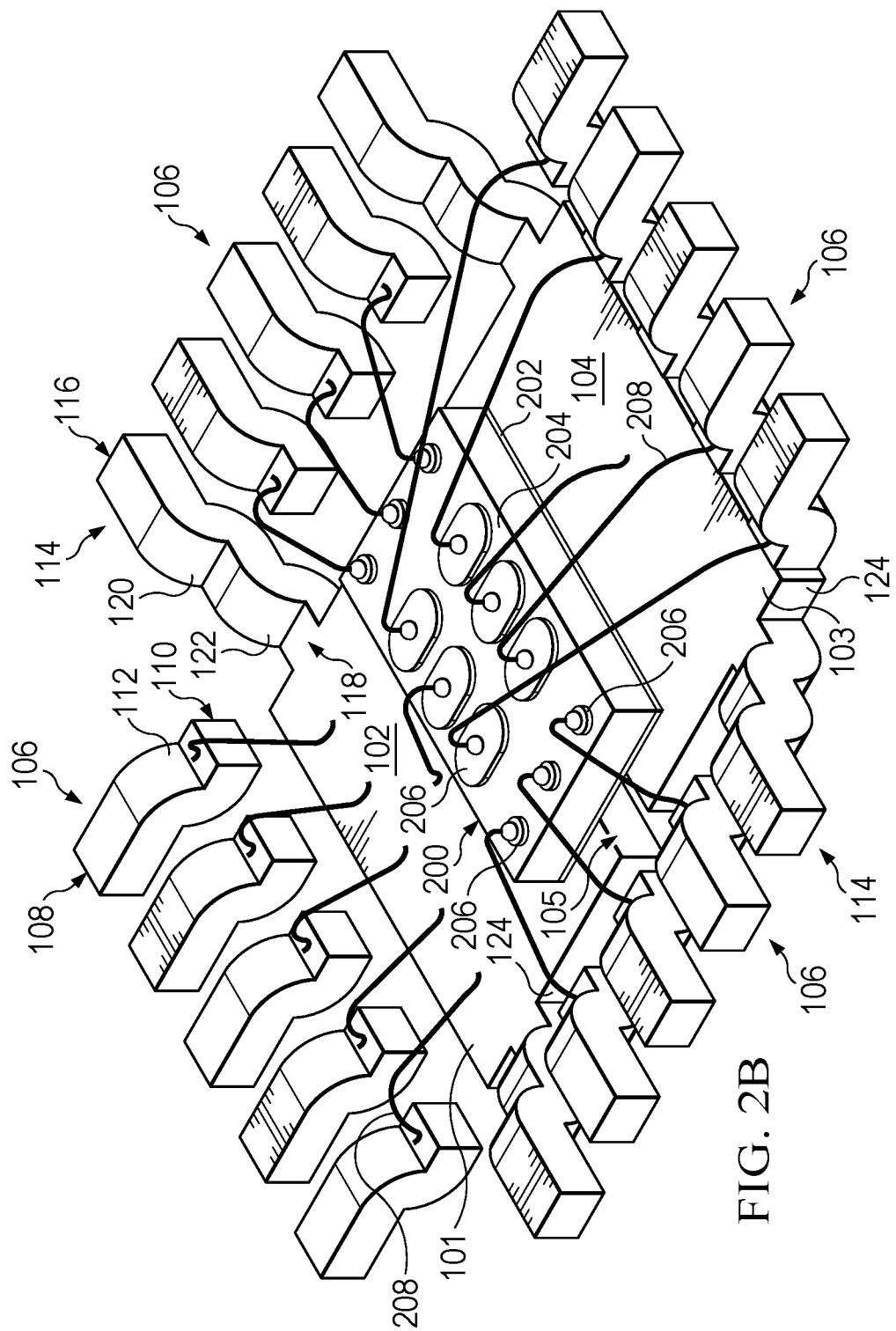
FIG. 2B is a perspective bottom view of a semiconductor die coupled to die pads and to dual down-set conductive terminals, in accordance with various examples.
Figure 2D:
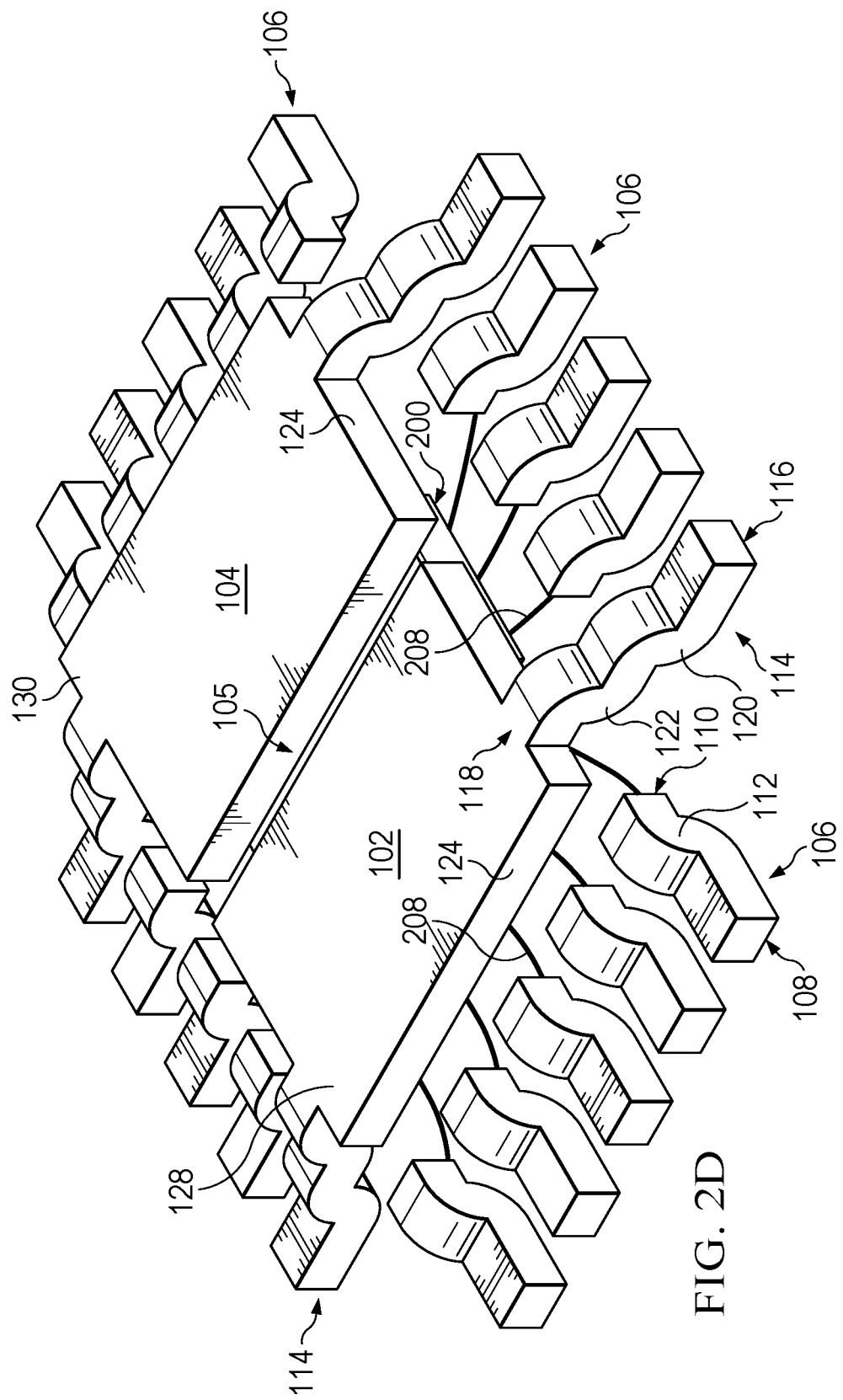
FIG. 2D is a perspective top view of a semiconductor die coupled to die pads and to dual down-set conductive terminals, in accordance with various examples.
Figure 2E:
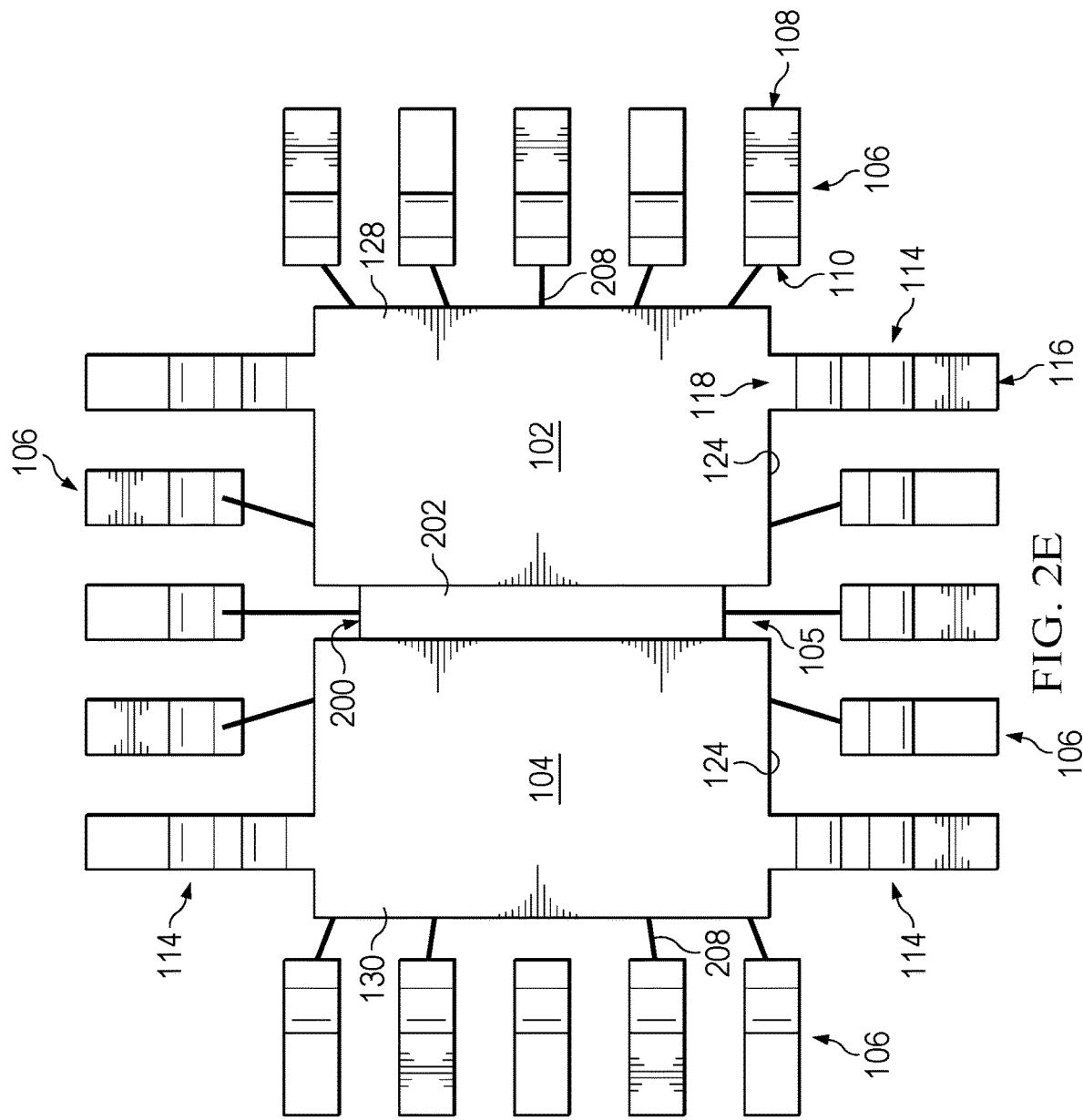
FIG. 2E is a top-down view of a semiconductor die coupled to die pads and to dual down-set conductive terminals, in accordance with various examples.
Figure 2F:
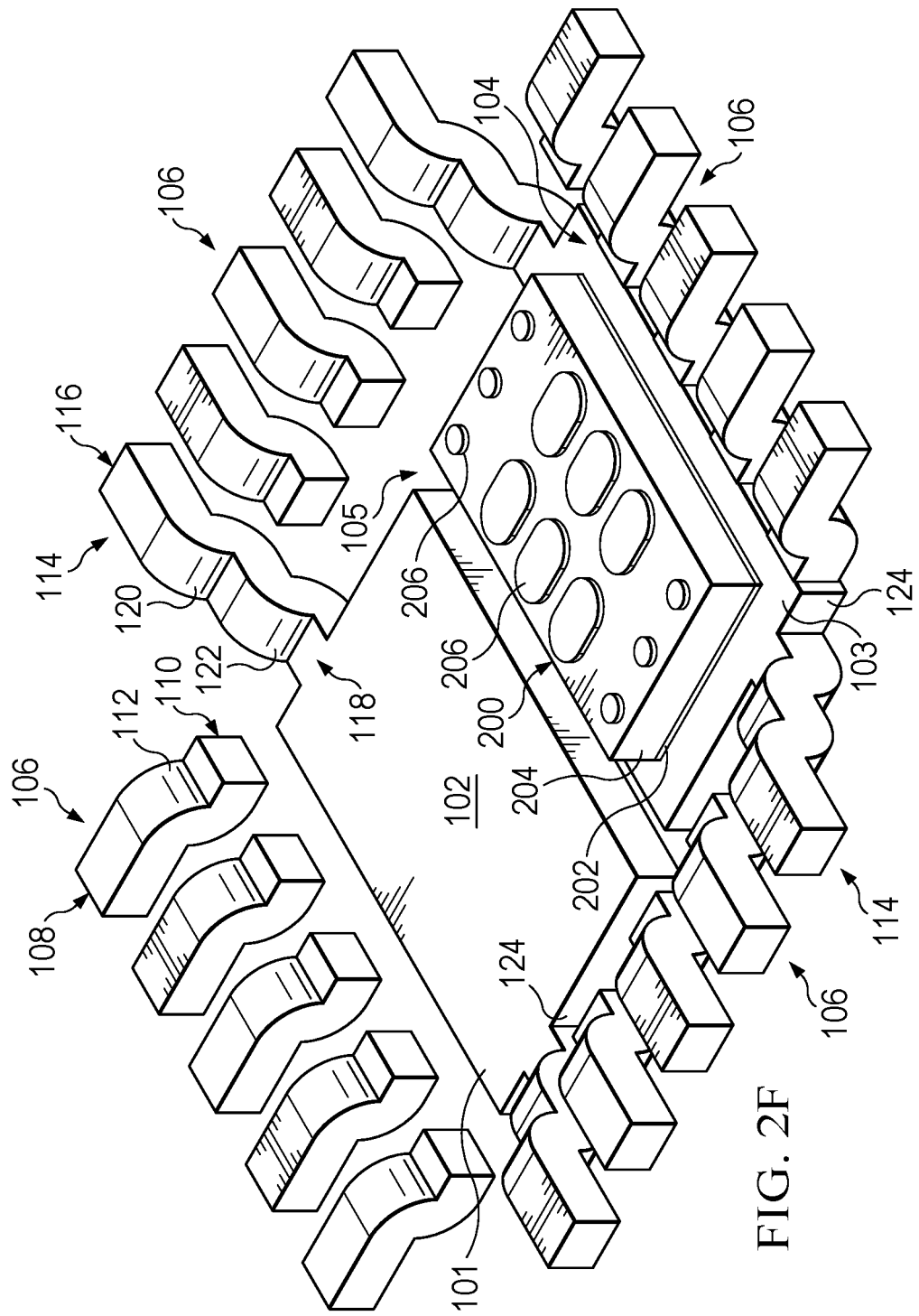
FIG. 2F is a perspective bottom view of dual down-set conductive terminals and of a semiconductor die coupled to a die pad, in accordance with various examples.
Figure 2G:
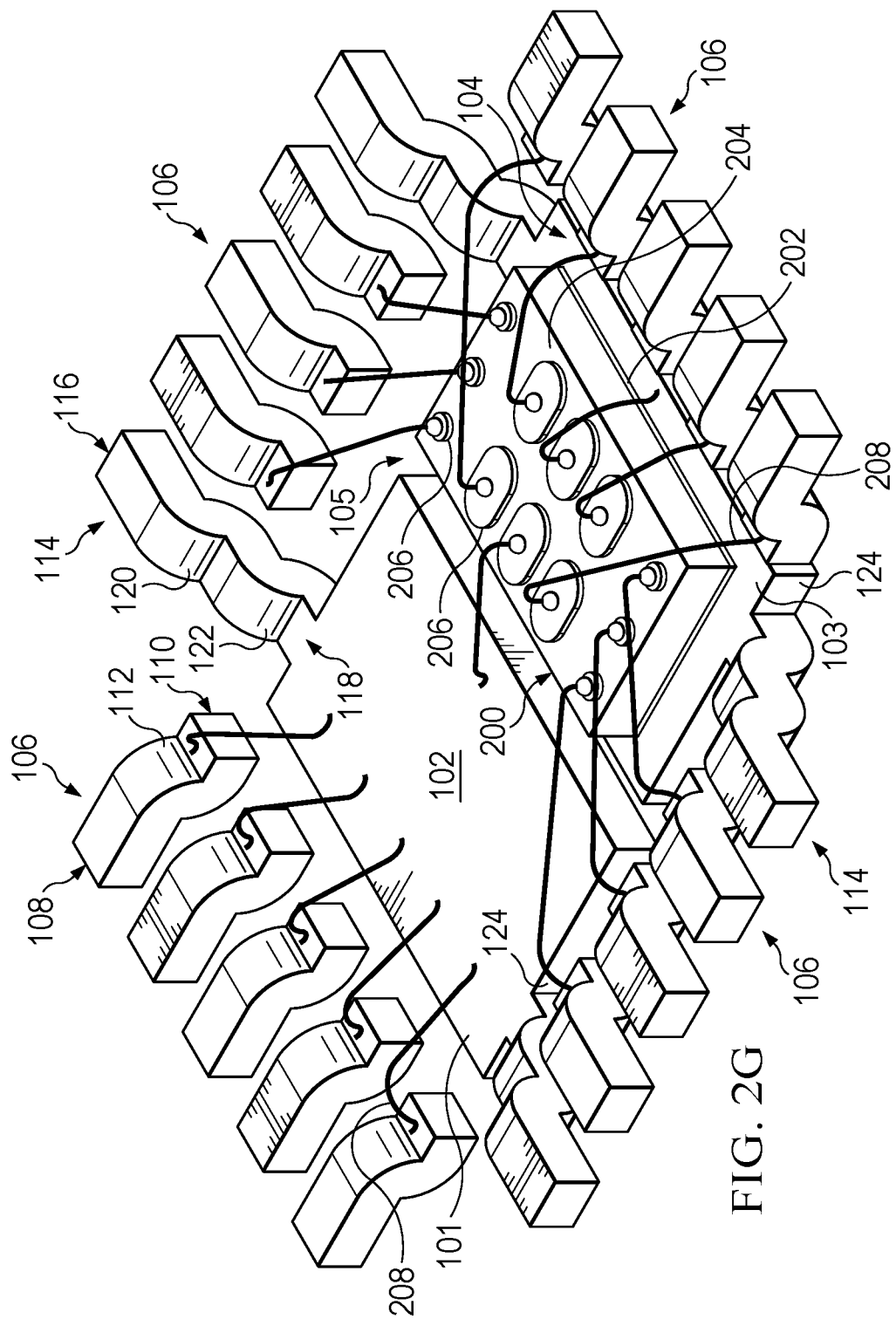
FIG. 2G is a perspective bottom view of a semiconductor die coupled to a die pad and to dual down-set conductive terminals, in accordance with various examples.
Figure 2H:
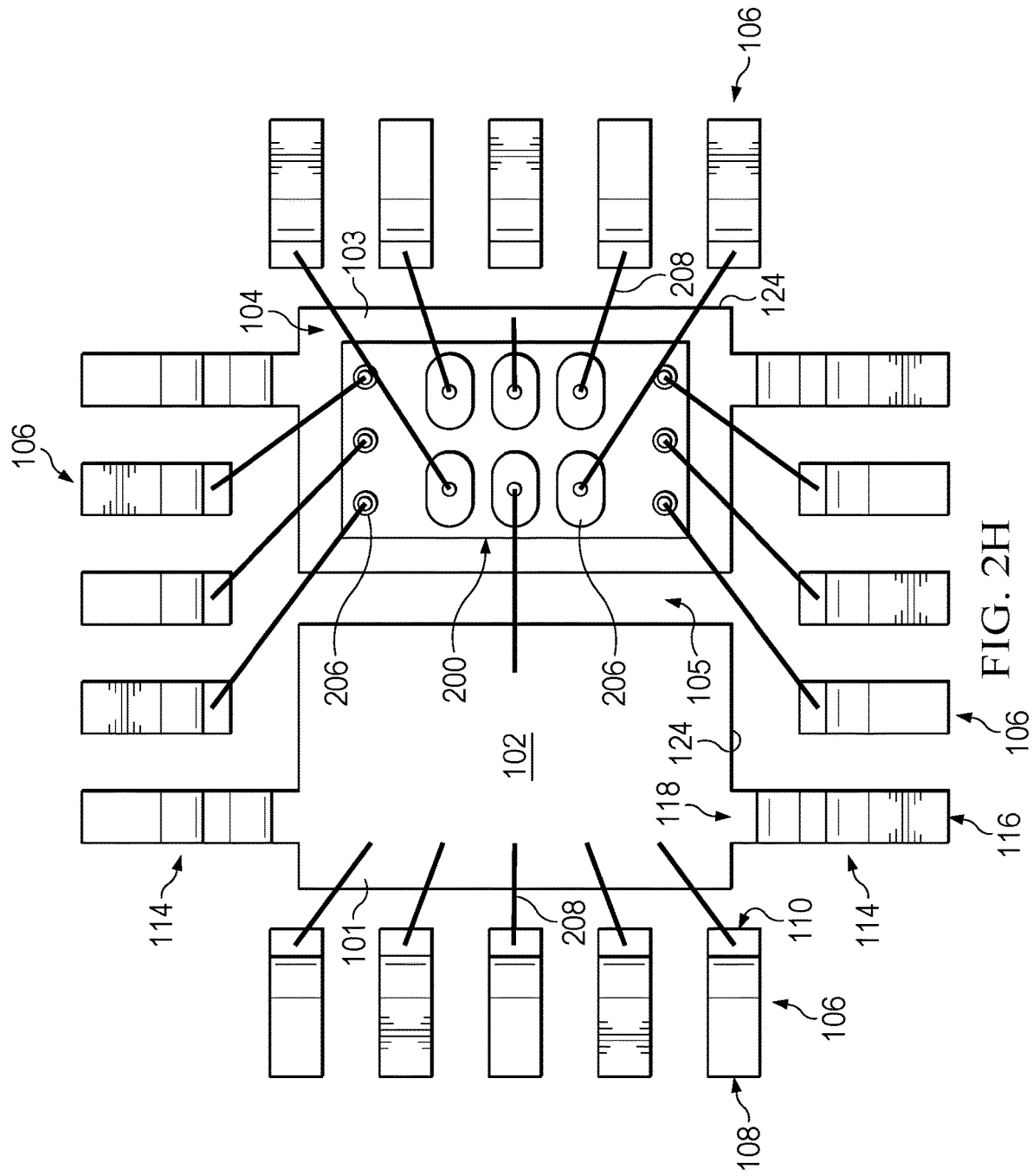
FIG. 2H is a bottom-up view of a semiconductor die coupled to a die pad and to dual down-set conductive terminals, in accordance with various examples.
Figure 2I:
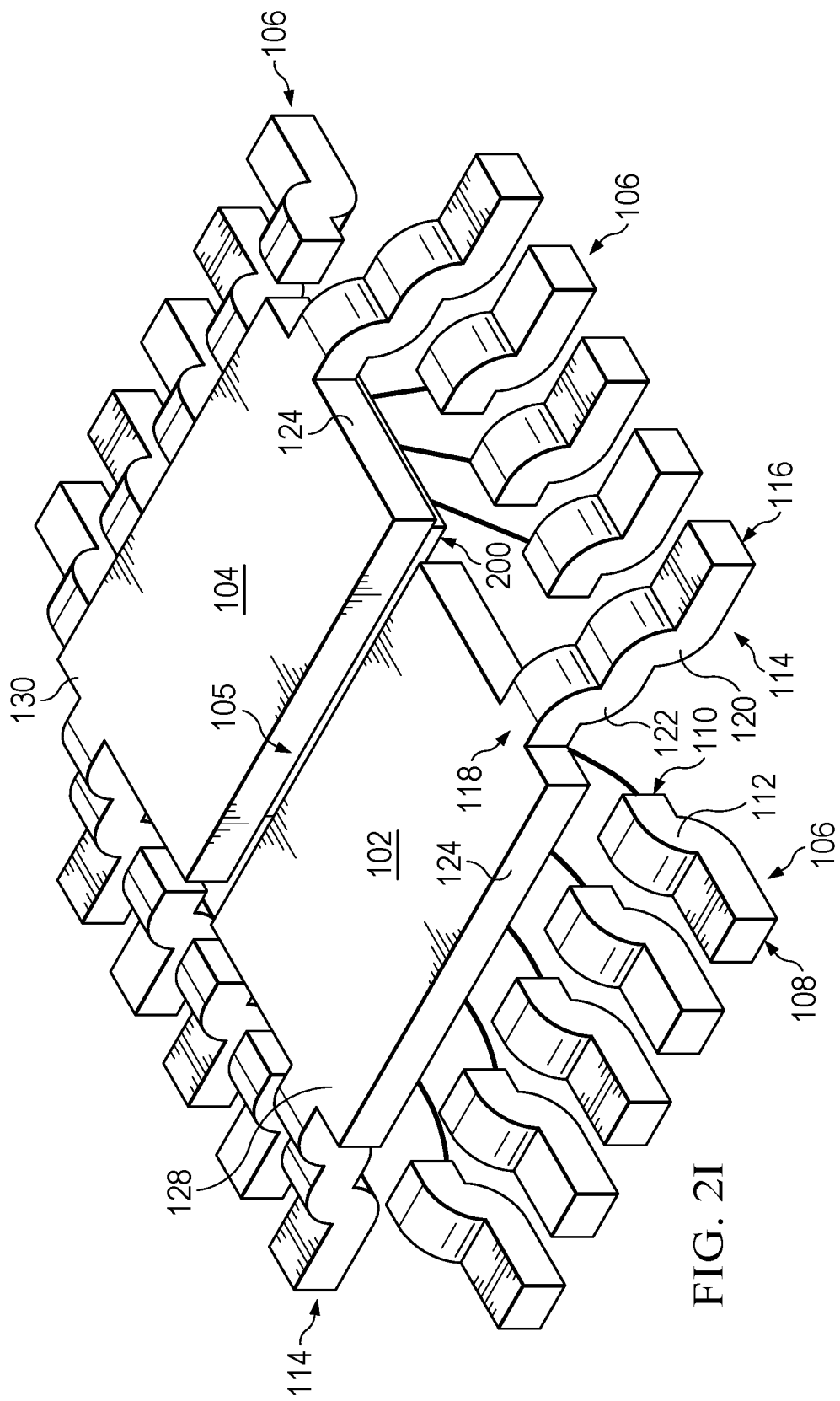
FIG. 2I is a perspective top view of a semiconductor die coupled to a die pad and to dual down-set conductive terminals, in accordance with various examples.
Figure 2J:
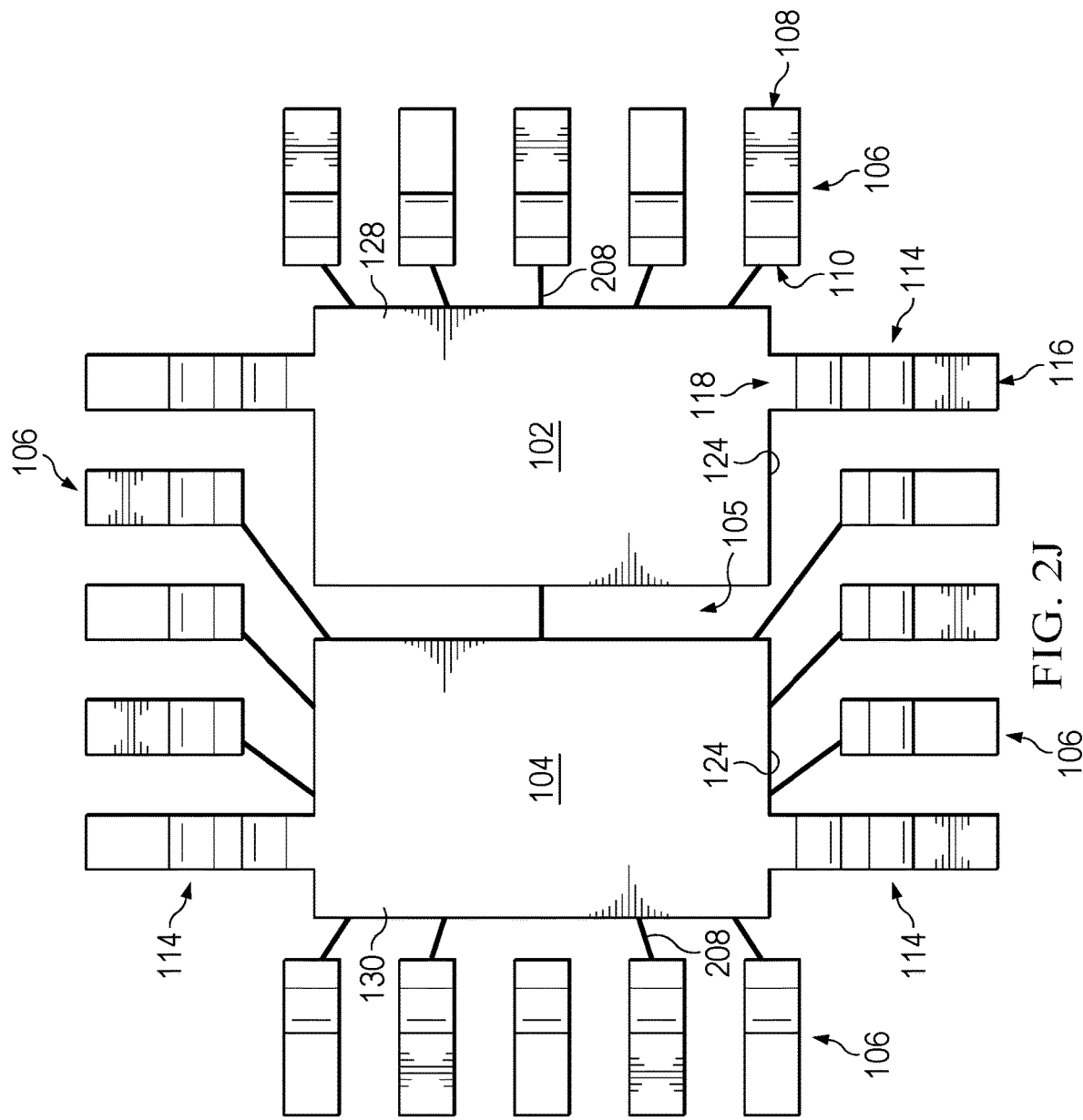
FIG. 2J is a top-down view of a semiconductor die coupled to a die pad and to dual down-set conductive terminals, in accordance with various examples.

The method 700 includes wirebonding the semiconductor die to the metal structure (706). FIG. 2B is a perspective bottom view of the structure of FIG. 2A, in accordance with various examples. Wirebonds 208 are formed to couple the bond pads 206 to the conductive terminals 106, 114 and/or to the die pads 102, 104. In some examples, the semiconductor die 200 may include electrical contacts on the device side 204 and on a non-device side opposing the device side 204 to facilitate coupling of the non-device side directly to the die pads 102, 104. In such examples, a paste may be useful to couple the semiconductor die 200 to the die pads 102, 104 in a manner that facilitates coupling of electrical contacts on the non-device side of the die 200 to the die pads 102, 104. FIG. 2C is a bottom-up view of the structure of FIG. 2B, in accordance with various examples. FIG. 2D is a perspective top view of the structure of FIG. 2B, in accordance with various examples. FIG. 2E is a top-down view of the structure of FIG. 2B, in accordance with various examples. FIGS. 2F-2J are identical to FIGS. 2A-2E, respectively, except that the semiconductor die 200 is coupled to a single die pad instead of to multiple die pads.

Figure 3A:
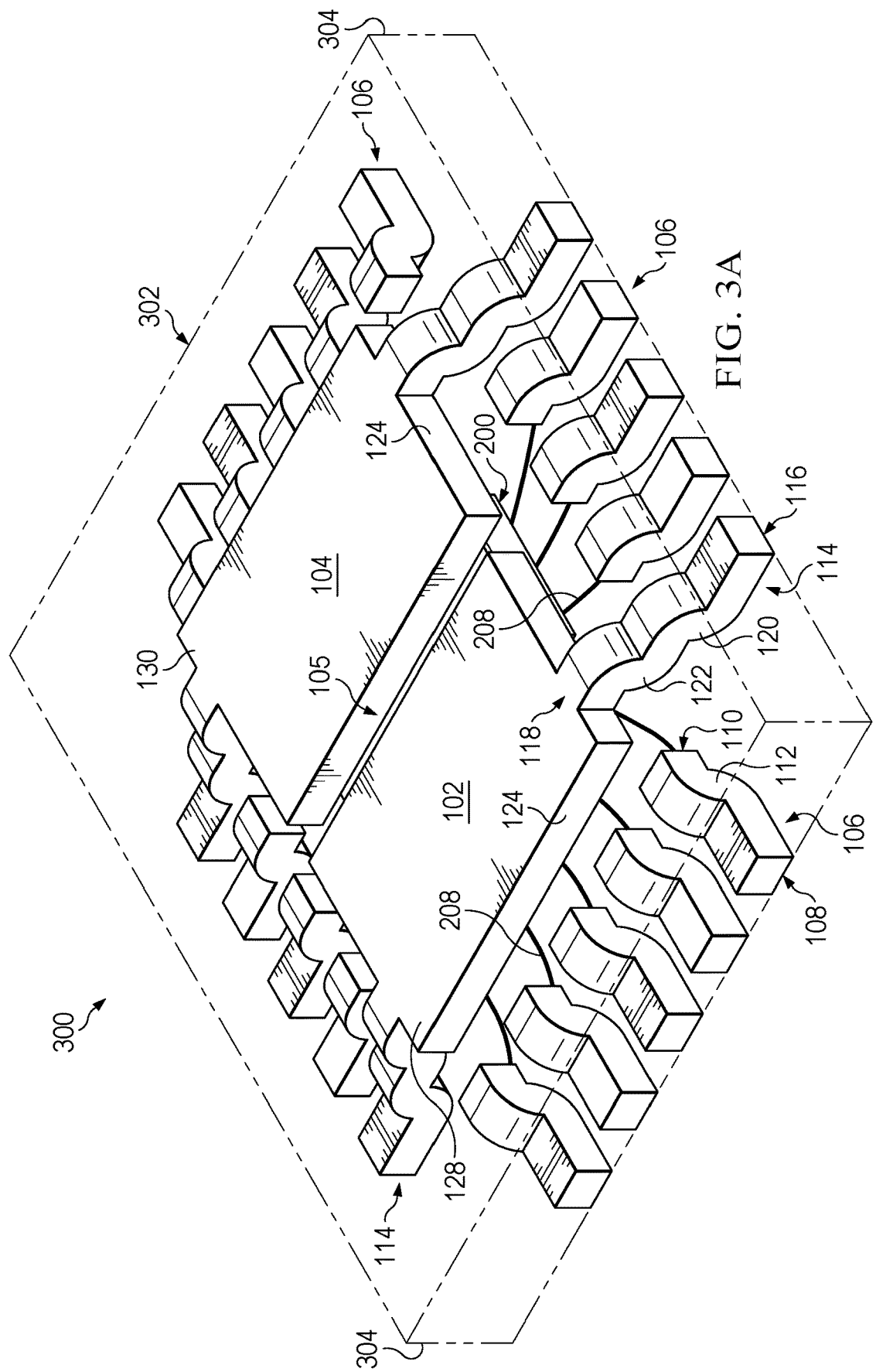
FIG. 3A is a perspective view of a semiconductor package having dual down-set conductive terminals for externally mounted passive components, in accordance with various examples.
Figure 3B:
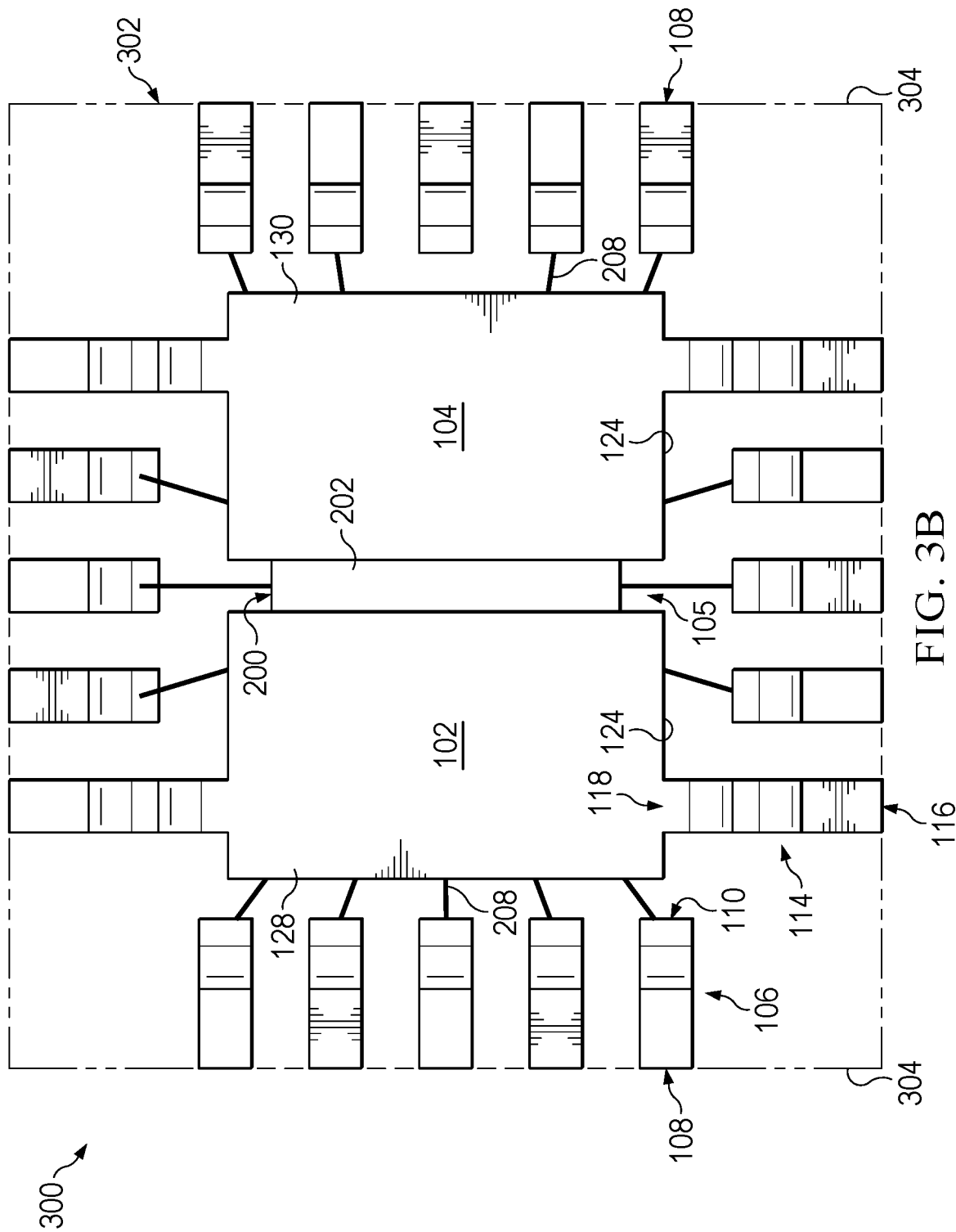
FIG. 3B is a top-down view of a semiconductor package having dual down-set conductive terminals for externally mounted passive components, in accordance with various examples.
Figure 3C:
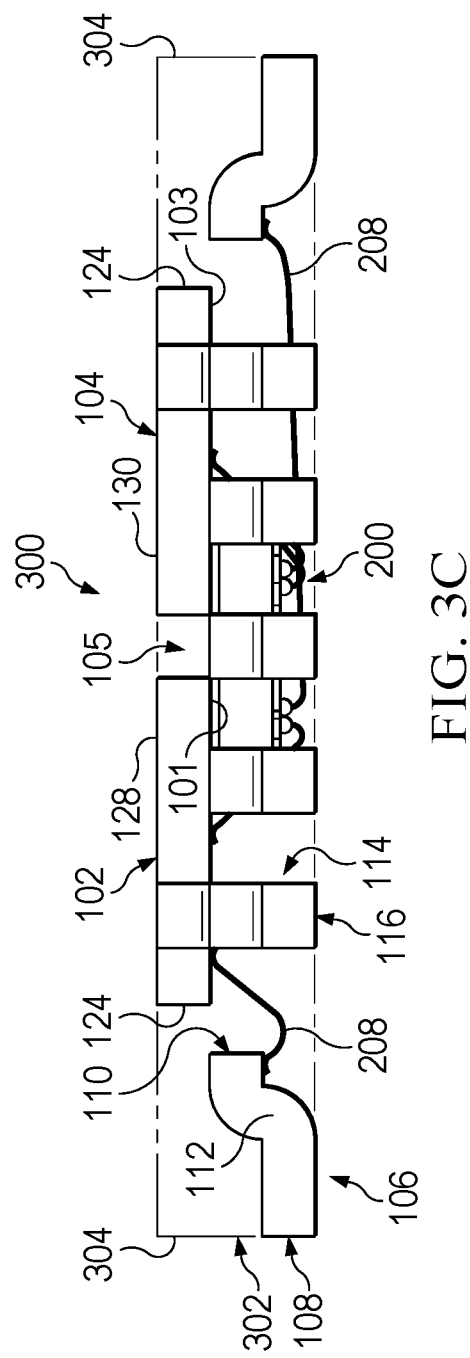
FIG. 3C is a profile view of a semiconductor package having dual down-set conductive terminals for externally mounted passive components, in accordance with various examples.
Figure 3D:
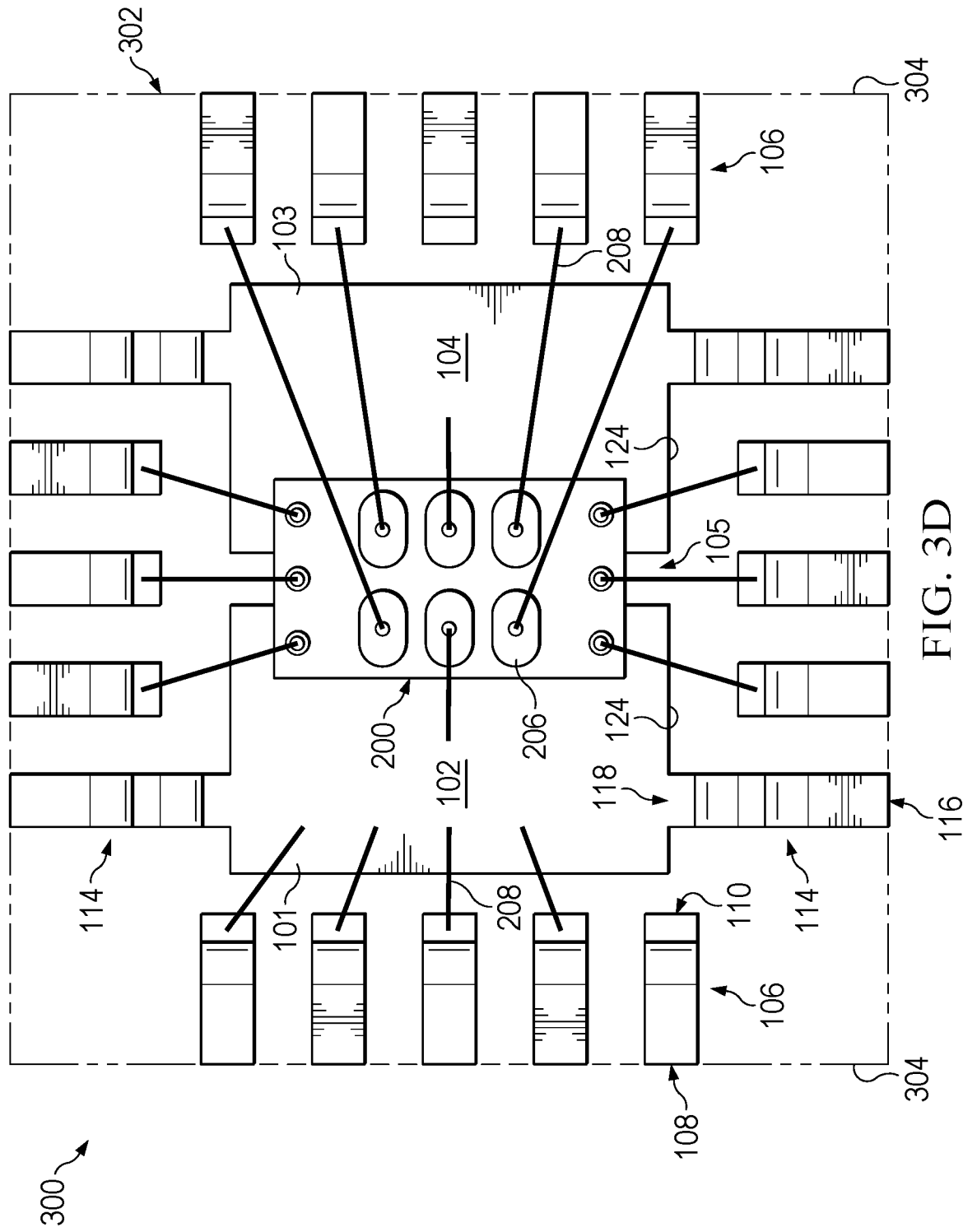
FIG. 3D is a bottom-up view of a semiconductor package having dual down-set conductive terminals for externally mounted passive components, in accordance with various examples.

The method 700 also includes covering the metal structure and the semiconductor die with a mold compound such that the top surfaces of the first and second die pads are exposed through a top surface of the mold compound (708). FIG. 3A is a perspective view of a semiconductor package having conductive terminals for externally mounted passive components, in accordance with various examples. Specifically, FIG. 3A shows a semiconductor package 300 (e.g., a quad-flat no lead (QFN) package) including the structure of FIGS. 2B-2E, covered by a mold compound 302. The mold compound 302 has lateral surfaces 304 that are perpendicular to the top surface of the mold compound 302. The top surfaces 128, 130 of the die pads 102, 104 are exposed through the top surface of the mold compound 302. In examples, the top surfaces 128, 130 are approximately flush with the top surface of the mold compound 302. In examples, the distal ends 108 and 116 of the conductive terminals 106 and 114 are exposed through the lateral surfaces 304 of the mold compound 302. In examples, the distal ends 108, 116 are approximately flush with the lateral surfaces 304, as shown. FIG. 3B is a top-down view of the structure of FIG. 3A, in accordance with various examples. FIG. 3C is a profile view of the structure of FIG. 3A, in accordance with various examples. FIG. 3D is a bottom-up view of the structure of FIG. 3A, in accordance with various examples. As FIG. 3D shows, the distal ends 108, 116 are exposed through a bottom surface of the mold compound 302 of the package 300.

Figure 4A:
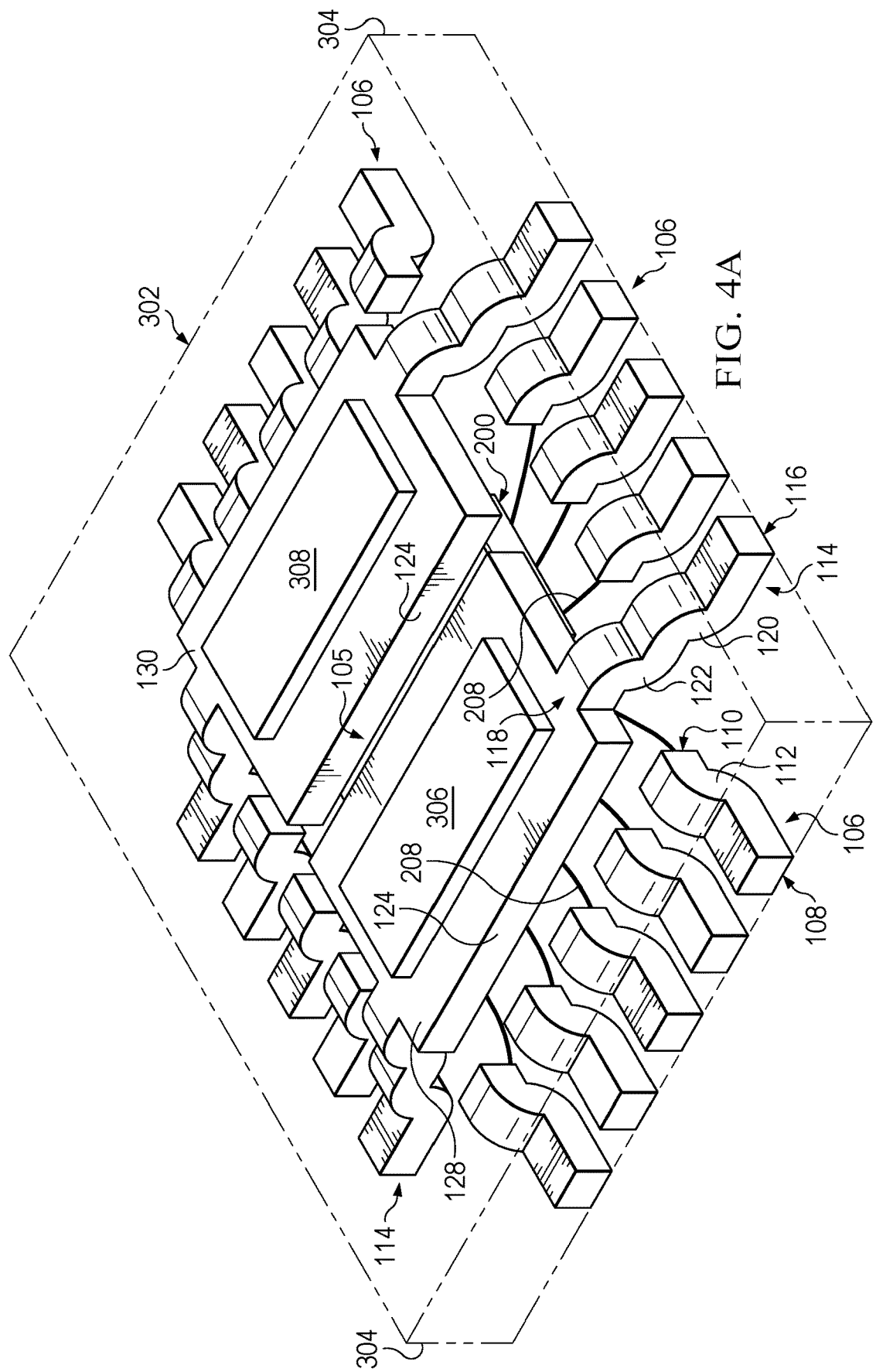
FIG. 4A is a perspective view of a semiconductor package having dual down-set conductive terminals for externally mounted passive components, in accordance with various examples.
Figure 4B:
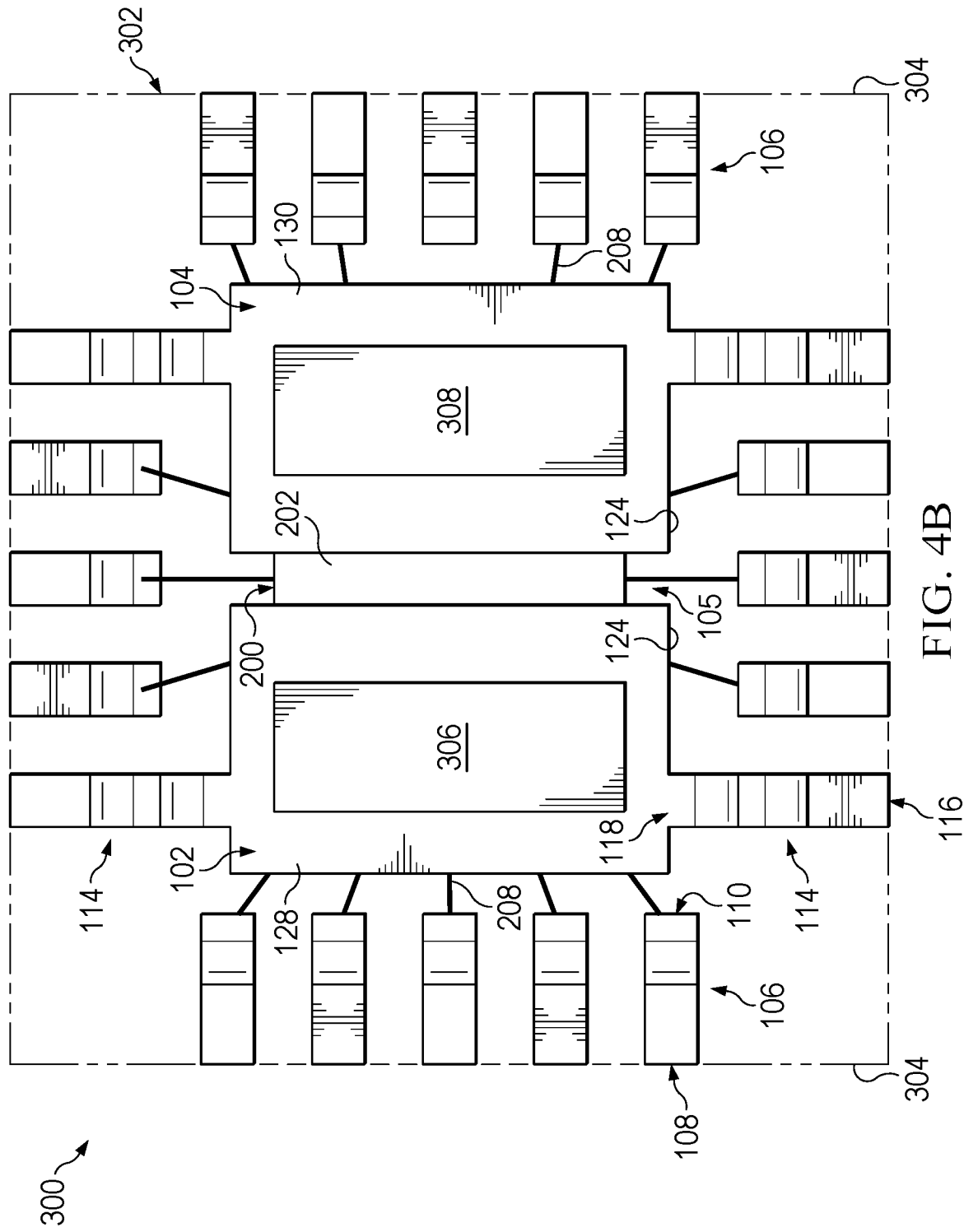
FIG. 4B is a top-down view of a semiconductor package having dual down-set conductive terminals for externally mounted passive components, in accordance with various examples.
Figure 4C:
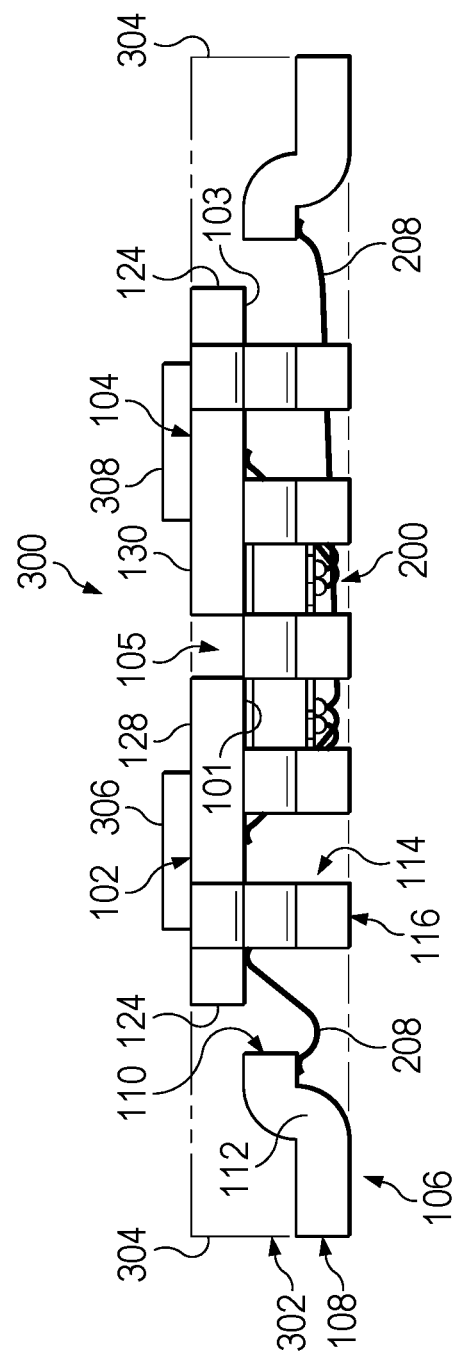
FIG. 4C is a profile view of a semiconductor package having dual down-set conductive terminals for externally mounted passive components, in accordance with various examples.
Figure 4D:
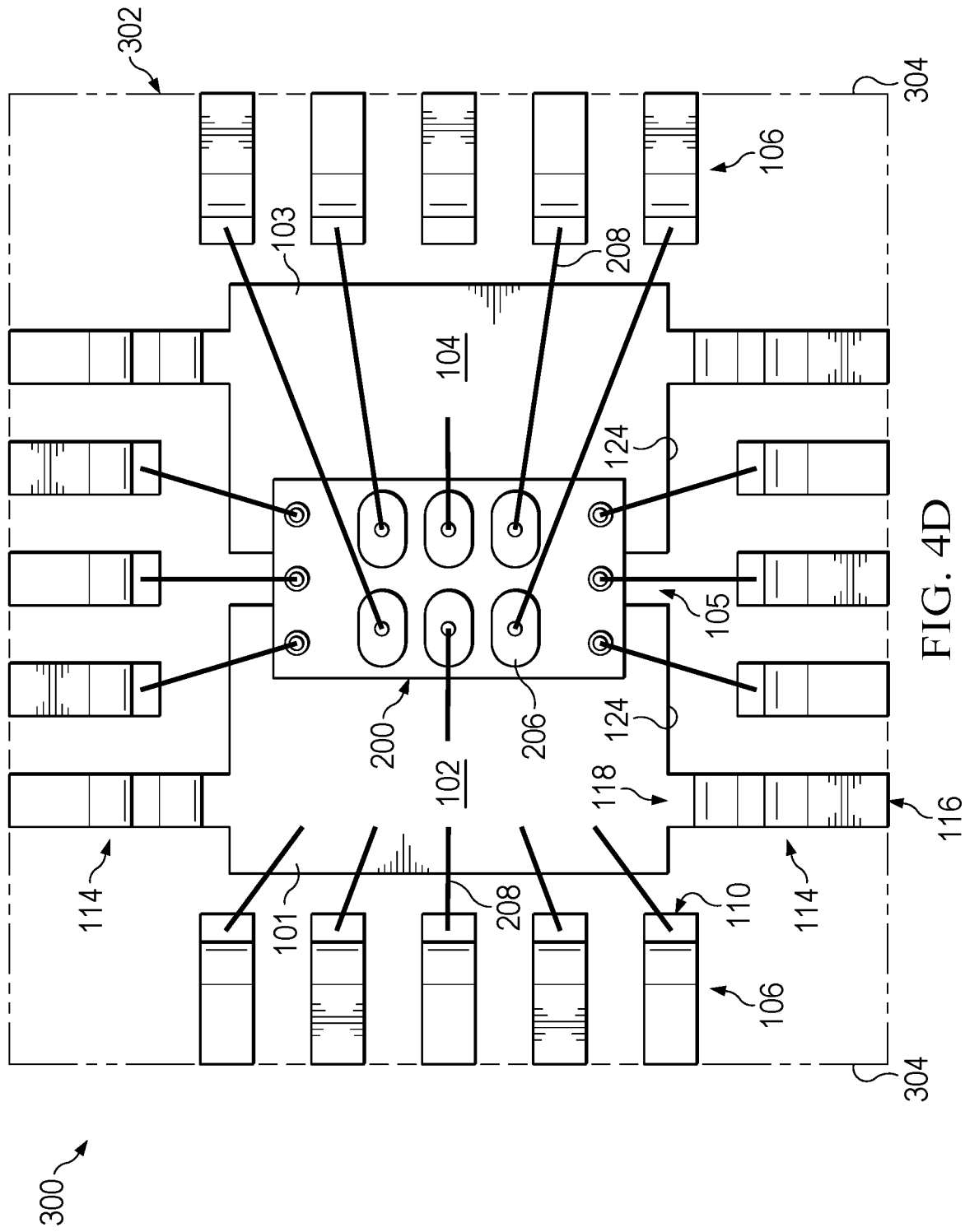
FIG. 4D is a bottom-up view of a semiconductor package having dual down-set conductive terminals for externally mounted passive components, in accordance with various examples.

The method 700 includes coupling a passive component to the top surfaces of the first and second die pads (710). FIG. 4A is a perspective view of the structure of FIGS. 3A-3D, except with the addition of printed solder members 306 and 308 on the top surfaces 128, 130 of the die pads 102, 104, as shown. FIG. 4B is a top-down view of the structure of FIG. 4A, in accordance with various examples. FIG. 4C is a profile view of the structure of FIG. 4A, in accordance with various examples. FIG. 4D is a bottom-up view of the structure of FIG. 4A, in accordance with various examples. The method 700 may include cutting the mold compound and the metal structure such that second ends of the first and second conductive terminals are exposed through a side surface of the mold compound that is orthogonal to the top surface of the mold compound, the second ends of the first and second conductive terminals are horizontally aligned with each other and are vertically lower than the first and second die pads (712). The drawings assume that step 712 has already been performed, to facilitate clarity and ease of understanding. However, such package singulation may occur at any suitable time in the method 700, including at the end of the method 700, as FIG. 7 shows.

Figure 5A:
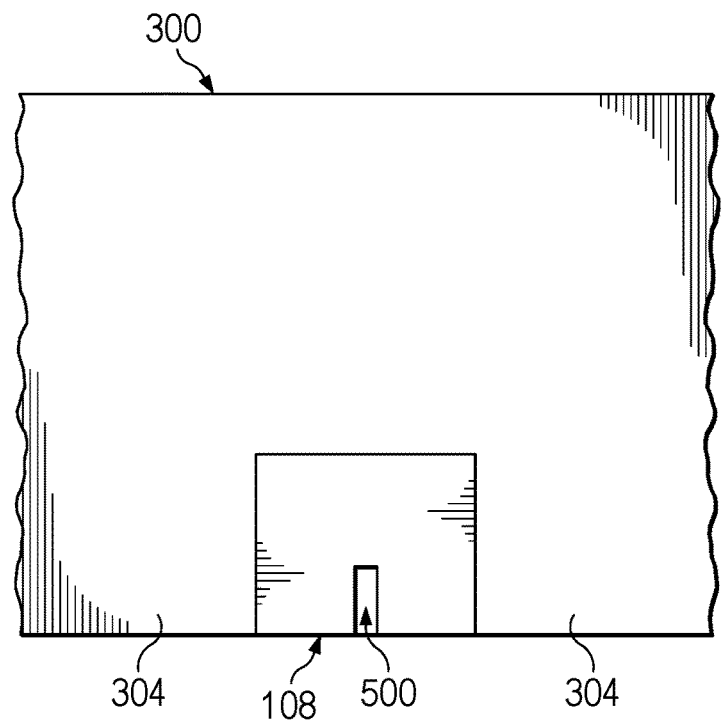
FIG. 5A is a close-up view of a lateral surface of a semiconductor package having dual down-set conductive terminals for externally mounted passive components, in accordance with various examples.
Figure 5B:
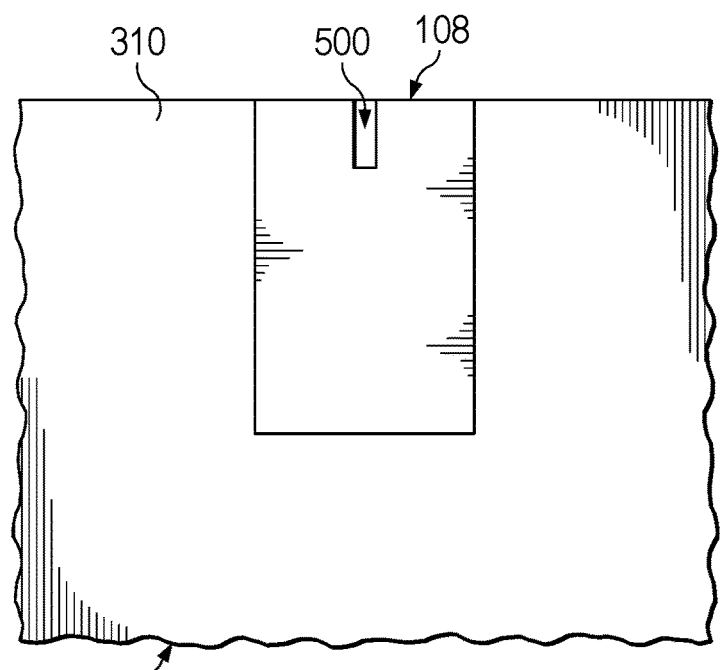
FIG. 5B is a close-up view of a bottom surface of a semiconductor package having dual down-set conductive terminals for externally mounted passive components, in accordance with various examples.

FIG. 5A is a close-up view of a lateral surface 304 of FIG. 3A, in accordance with various examples. In some examples, multiple distal ends 108 are exposed through a lateral surface 304, as described above. In some examples, the lateral surfaces 304 of the package 300 may include cavities 500 that facilitate the flow of solder during coupling to a printed circuit board. FIG. 5B shows a bottom surface 310 of the package 300, in which the cavity 500 extends to the bottom surface 310.

Figure 6A:
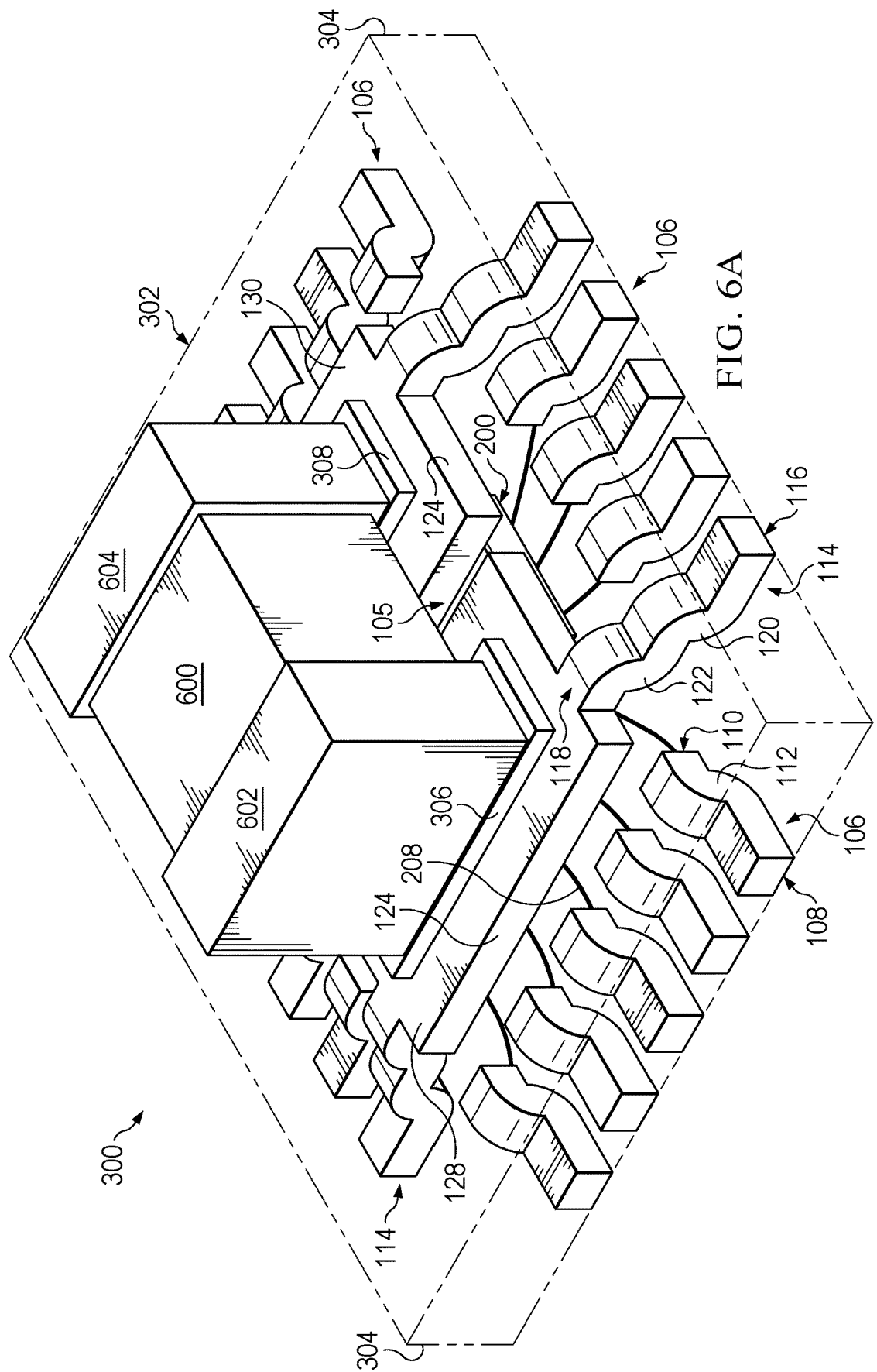
FIG. 6A is a perspective view of a semiconductor package having dual down-set conductive terminals and an externally mounted passive component, in accordance with various examples.
Figure 6B:
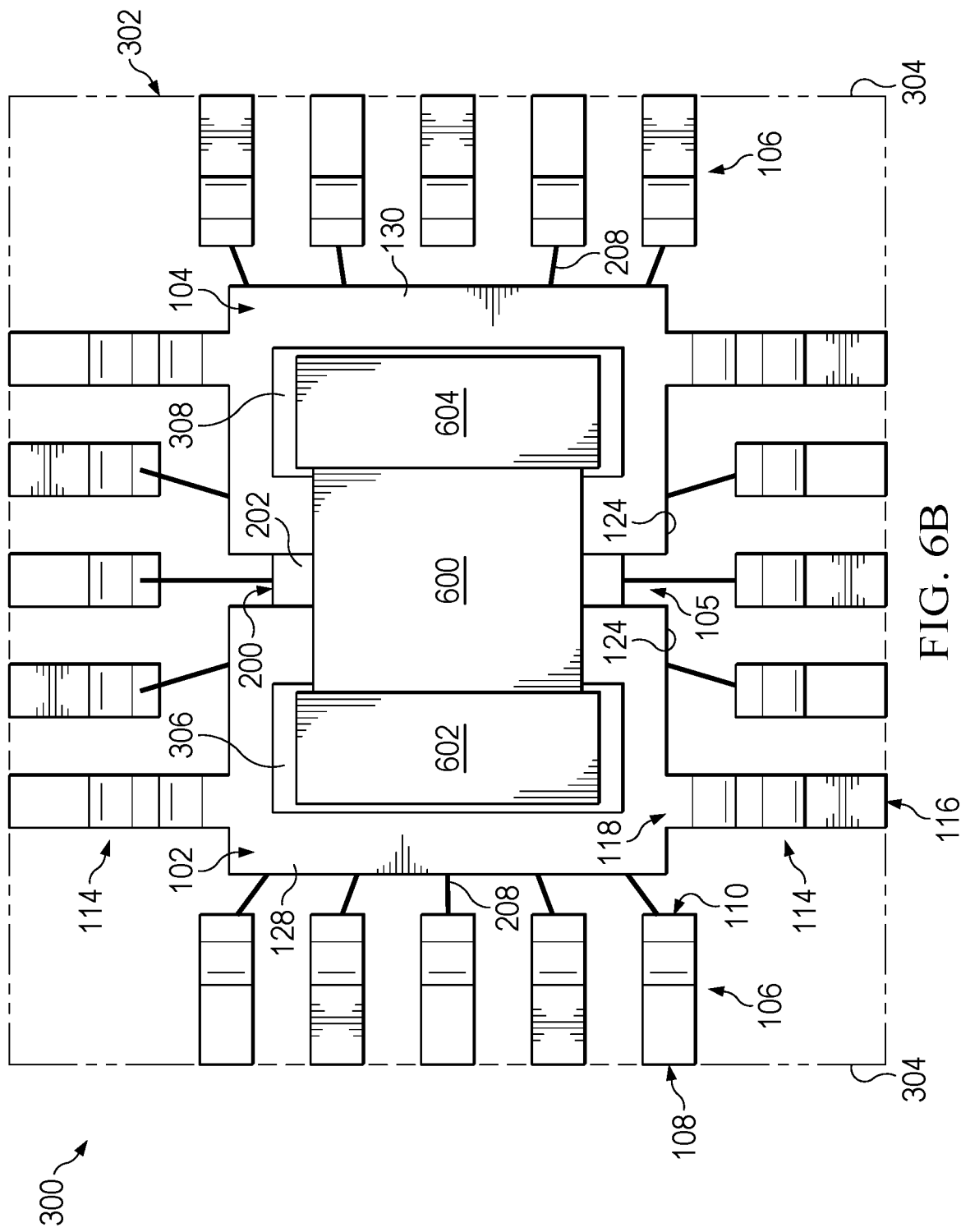
FIG. 6B is a top-down view of a semiconductor package having dual down-set conductive terminals and an externally mounted passive component, in accordance with various examples.
Figure 6C:
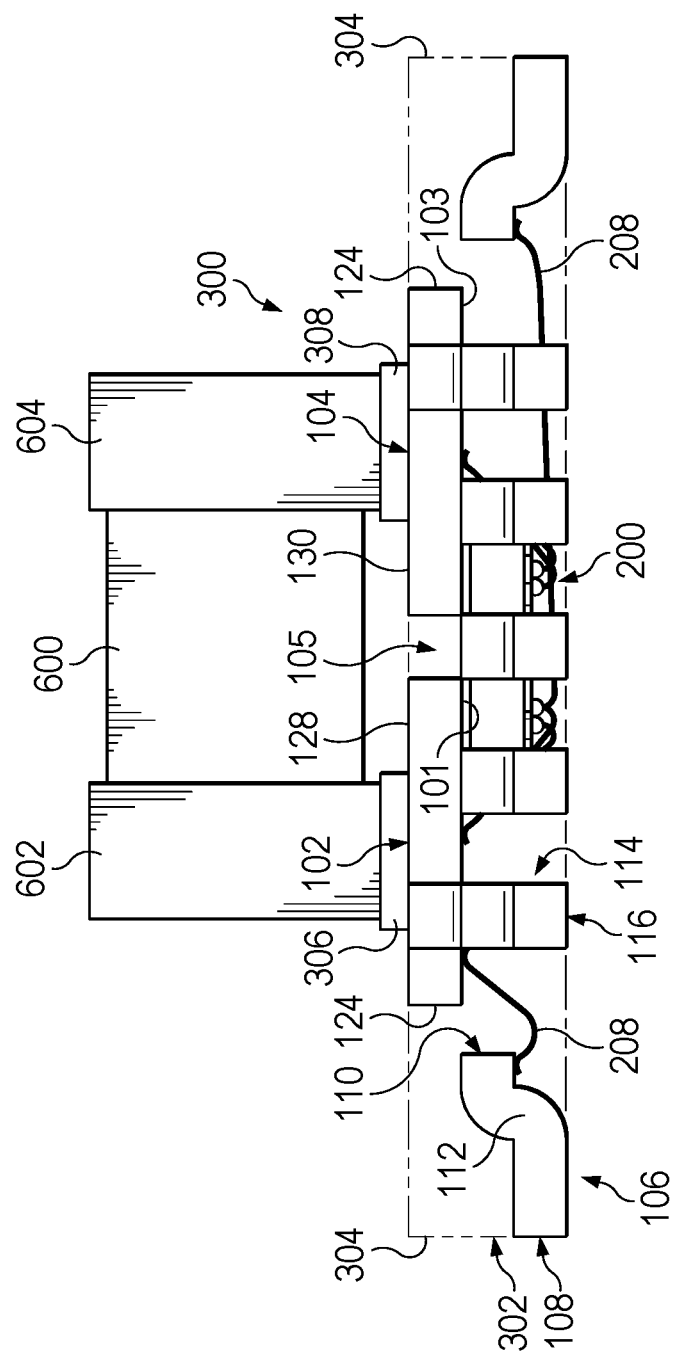
FIG. 6C is a profile view of a semiconductor package having dual down-set conductive terminals and an externally mounted passive component, in accordance with various examples.
Figure 7:
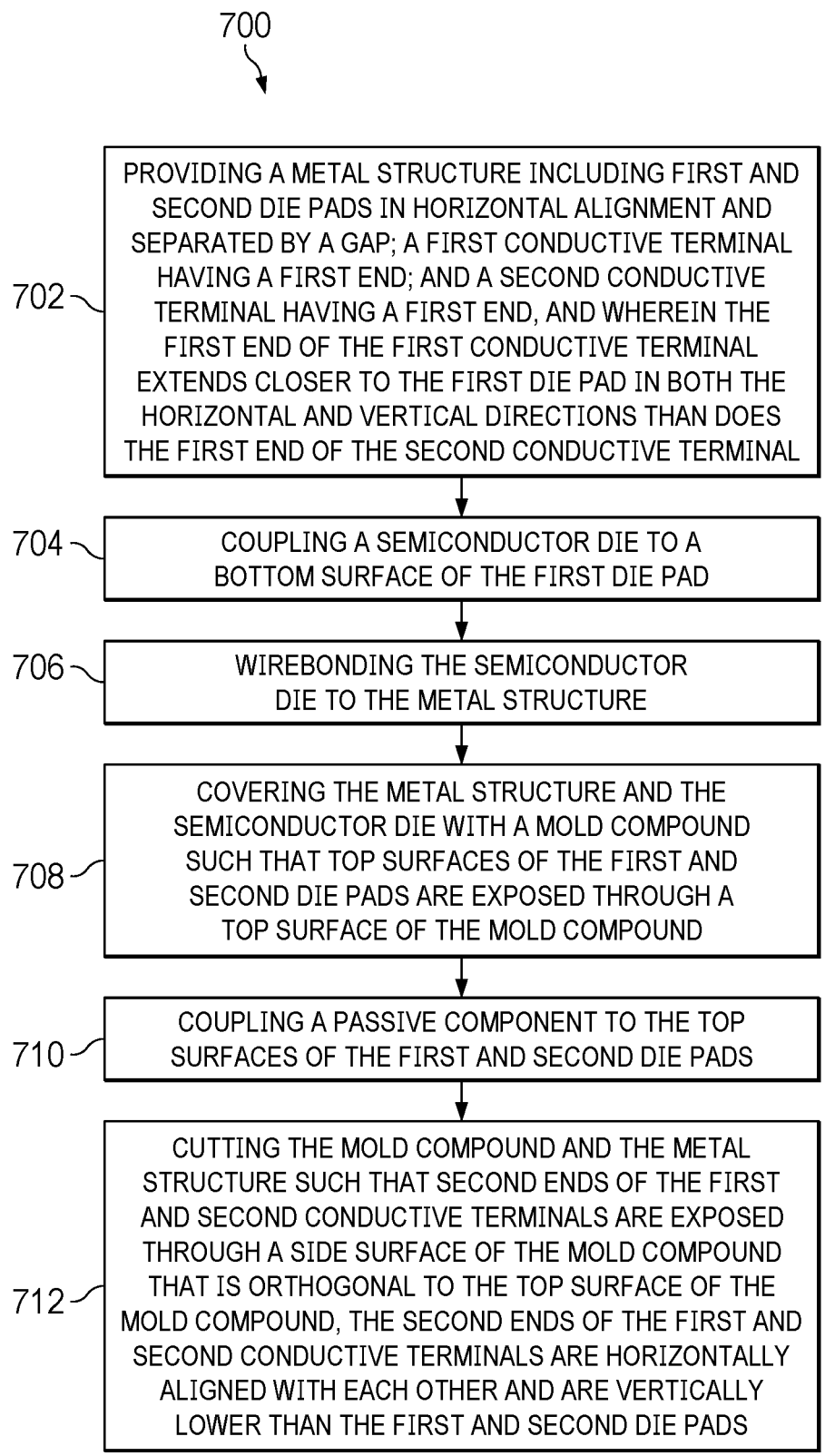
FIG. 7 is a flow diagram of a method for manufacturing a semiconductor package having dual down-set conductive terminals and an externally mounted passive component, in accordance with various examples.

FIG. 6A is a perspective view of the semiconductor package 300 including an externally mounted passive component, in accordance with various examples. Specifically, FIG. 6A shows a passive component 600 (e.g. inductor, capacitor, resistor) having a terminal 602 coupled to the printed solder member 306 and a terminal 604 coupled to the printed solder member 308. FIG. 6B is a top-down view of the structure of FIG. 6A, in accordance with various examples. FIG. 6C is a profile view of the structure of FIG. 6A, in accordance with various examples. FIG. 6D is a profile view of the structure of FIG. 6A, in accordance with various examples.

Figure 6E:
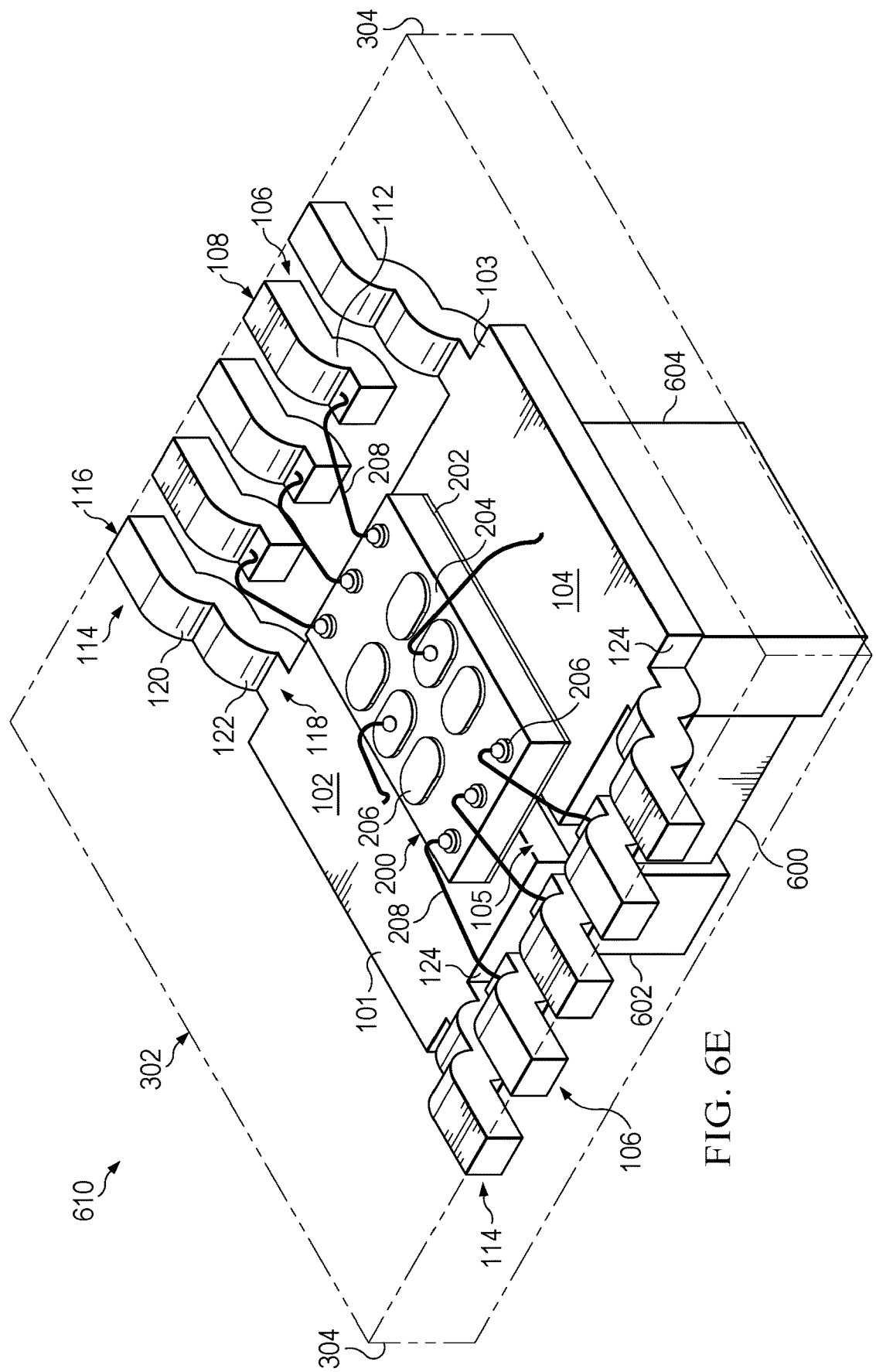
FIG. 6E is a perspective view of a semiconductor package having dual down-set conductive terminals and an externally mounted passive component, in accordance with various examples.
Figure 6F:
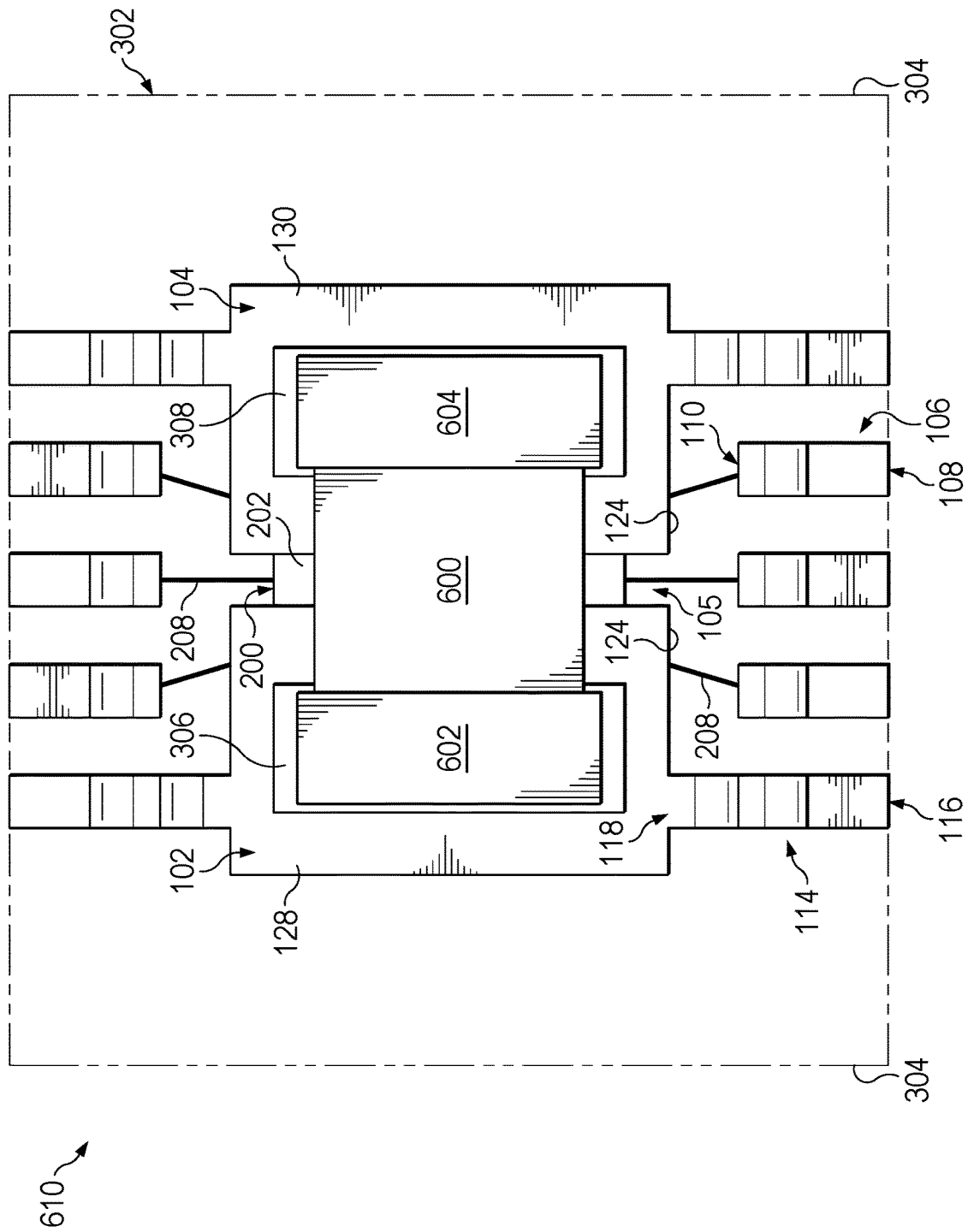
FIG. 6F is a top-down view of a semiconductor package having dual down-set conductive terminals and an externally mounted passive component, in accordance with various examples.
Figure 6G:
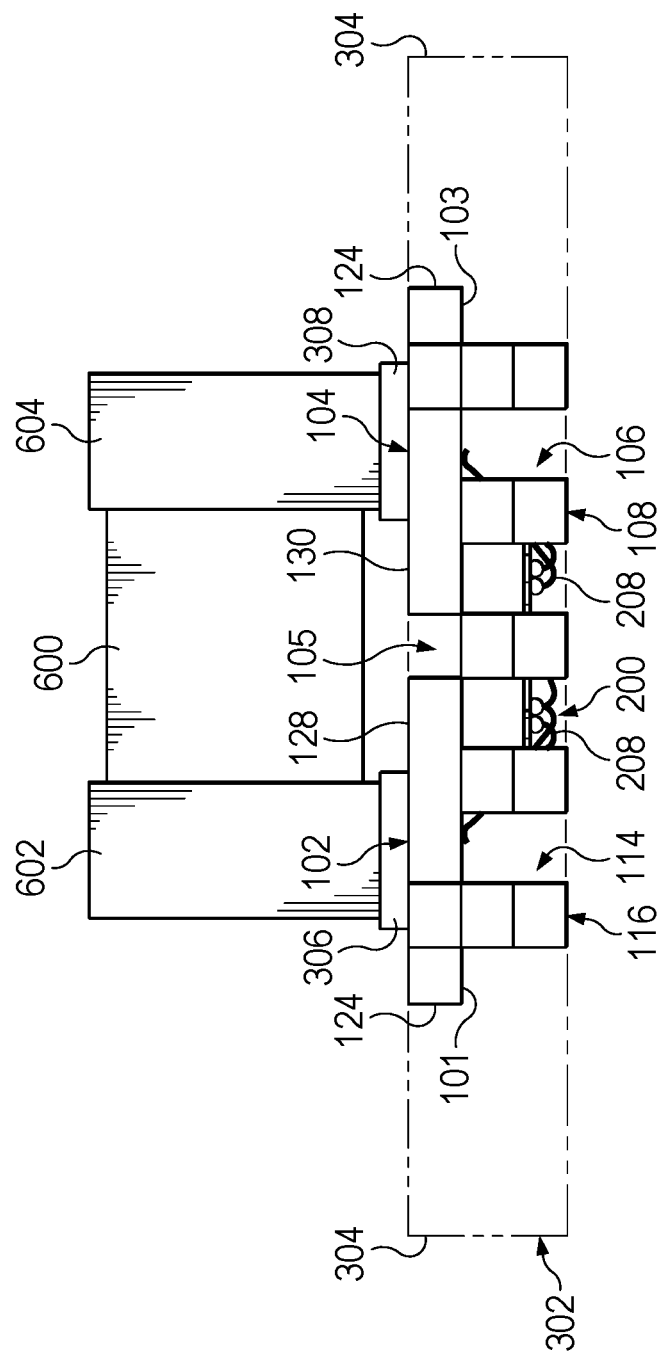
FIG. 6G is a profile view of a semiconductor package having dual down-set conductive terminals and an externally mounted passive component, in accordance with various examples.

Although this description is provided primarily in the context of a quad flat no-lead (QFN) type package, other package types are contemplated. For example, FIG. 6E shows a perspective view of a semiconductor package 610 that is a dual flat no-lead (DFN) type package. The structure of the DFN semiconductor package 610 of FIG. 6E may be similar or the same as that for the QFN package of FIG. 1A, but with conductive terminals omitted from two opposing sides, as shown. FIG. 6F is a top-down view of the structure of FIG. 1G, in accordance with various examples. FIG. 6G is a profile view of the structure of FIG. 1G, in accordance with various examples. FIG. 6H is another profile view of the structure of FIG. 1G, in accordance with various examples.

Figure 6I:
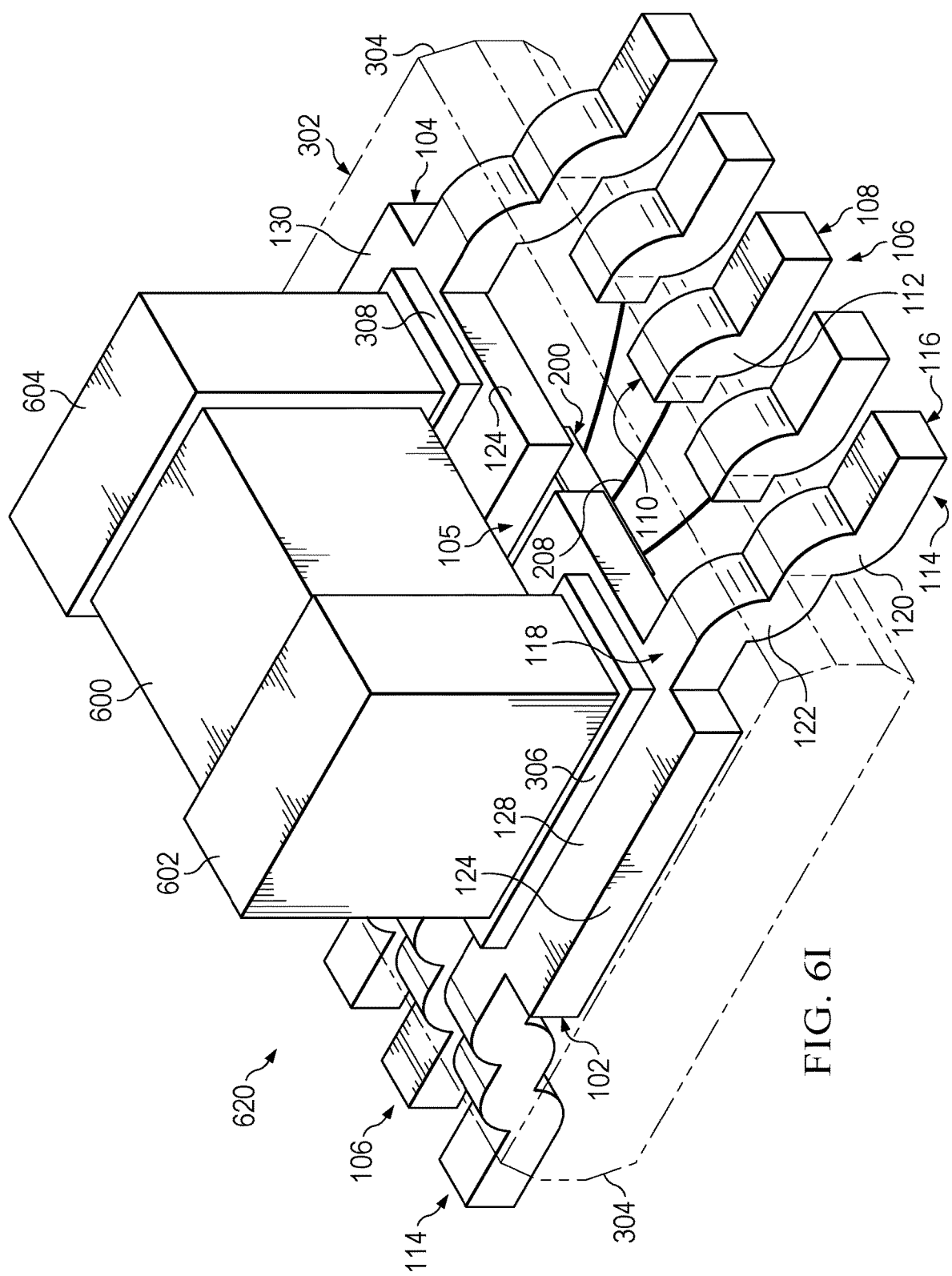
FIG. 6I is a perspective view of a semiconductor package having dual down-set conductive terminals and an externally mounted passive component, in accordance with various examples.
Figure 6J:
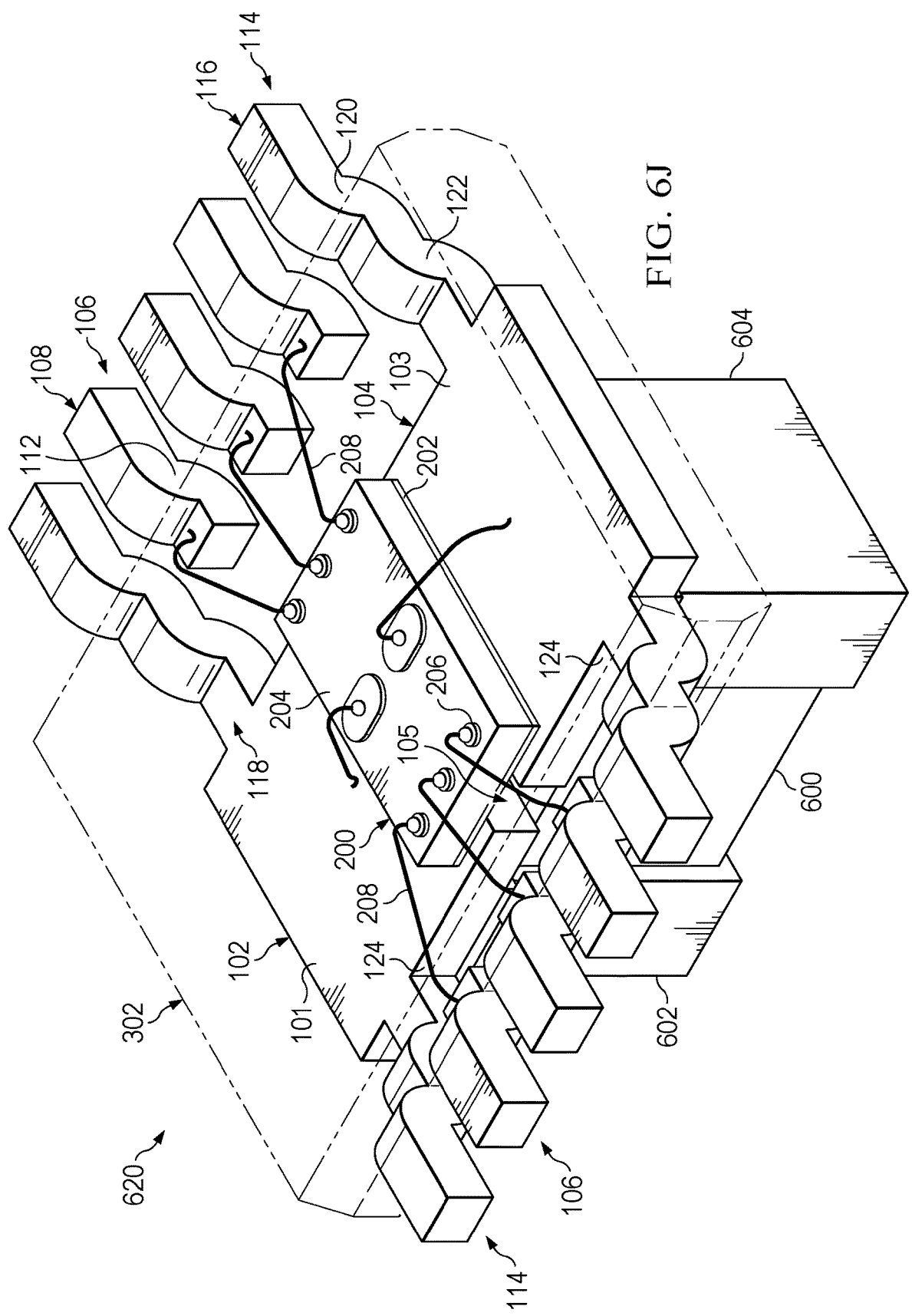
FIG. 6J is a top-down view of a semiconductor package having dual down-set conductive terminals and an externally mounted passive component, in accordance with various examples.
Figure 6K:
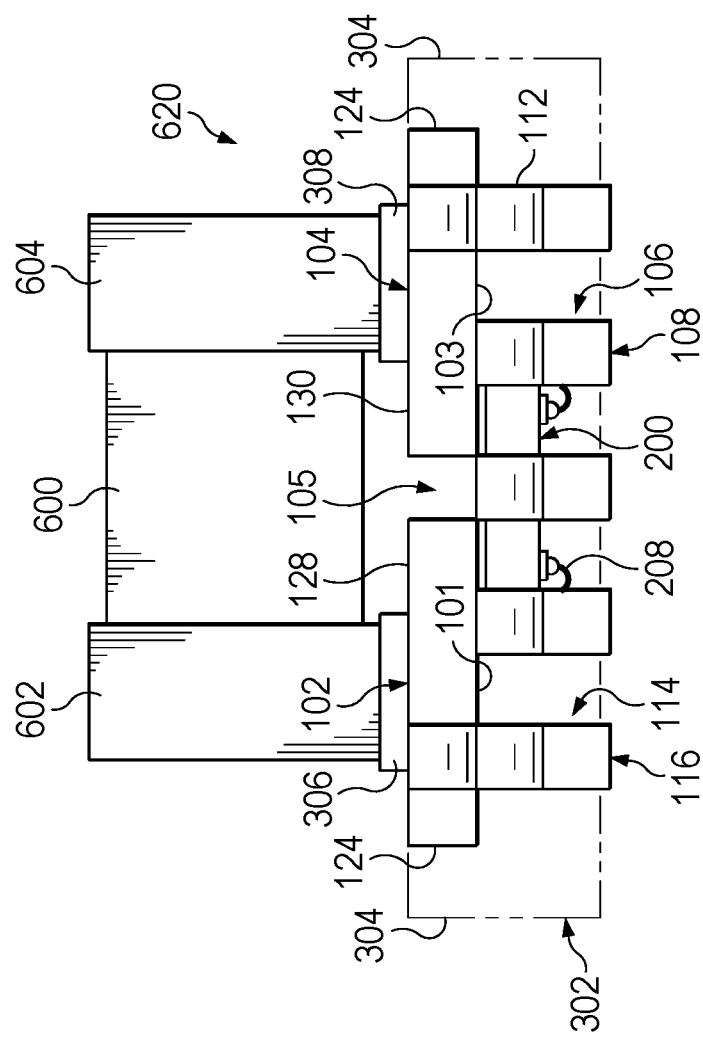
FIG. 6K is a profile view of a semiconductor package having dual down-set conductive terminals and an externally mounted passive component, in accordance with various examples.
Figure 6L:
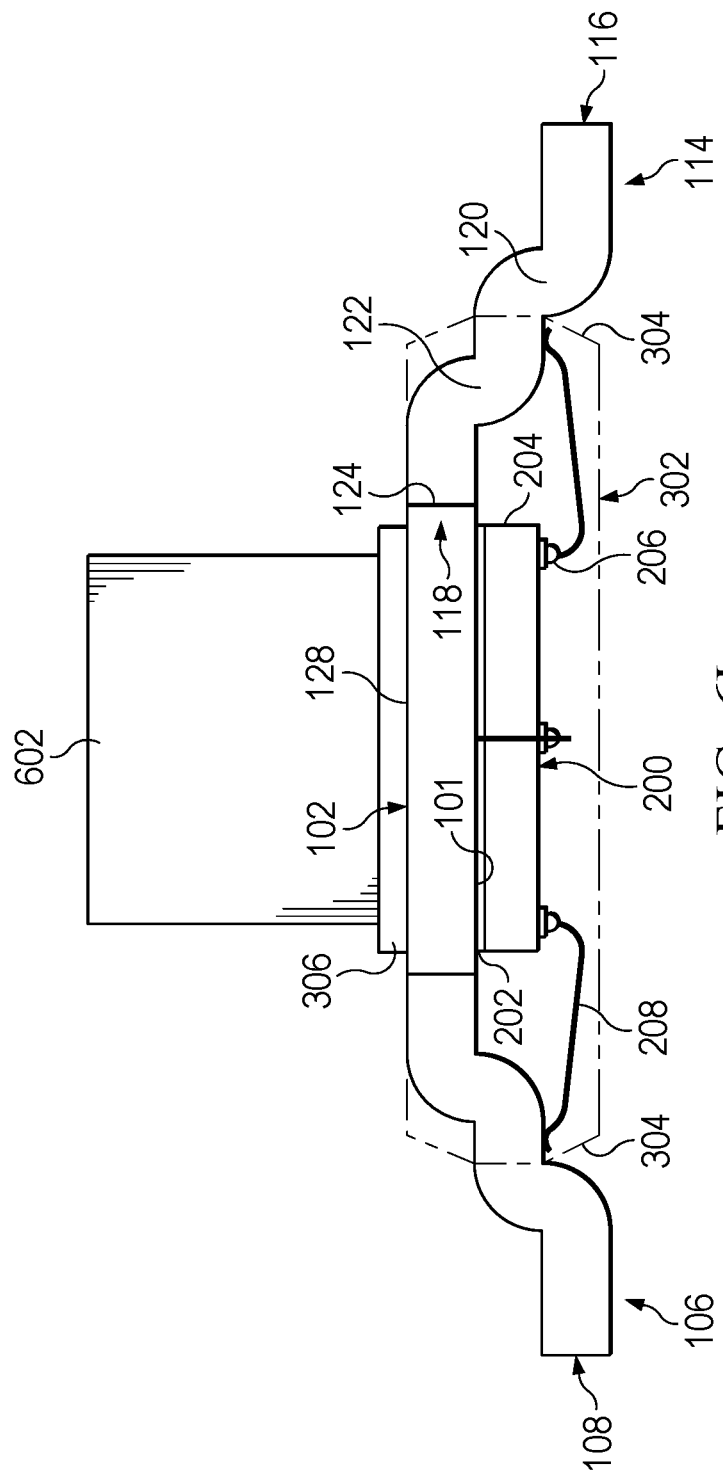
FIG. 6L is a profile view of a semiconductor package having dual down-set conductive terminals and an externally mounted passive component, in accordance with various examples.

Yet other package types are contemplated and included in the scope of this disclosure, including small outline transistor (SOT), small outline integrated circuit (SOIC), small outline package (SOP), dual inline package (DIP), and quad flat package (QFP) type packages. Other packages are also contemplated. FIG. 6I shows a perspective view of a semiconductor package 620 having a gullwing style configuration, meaning that the example conductive terminals 106, 114 of FIG. 6I may be longer than the example conductive terminals 106, 114 shown in other drawings and described above, such that the conductive terminals 106, 114 extend beyond the lateral surfaces of the mold compound 302. Because the conductive terminals 106, 114 extend beyond the lateral surfaces of the mold compound 302 and extend vertically lower than a bottom surface of the mold compound 302, the conductive terminals 106, 114 are suitable for connecting (e.g., soldering) to a printed circuit board or other substrate. As described above, the conductive terminals 106 may have fewer down-sets than the conductive terminals 114. FIG. 6J is a bottom-up view of the structure of FIG. 6I, in accordance with examples. FIG. 6K is a profile view of the structure of FIG. 6I, in accordance with examples. FIG. 6L is a profile view of the structure of FIG. 6I, in accordance with examples.

In this description, the term "couple" may cover connections, communications or signal paths that enable a functional relationship consistent with this description. For example, if device A provides a signal to control device B to perform an action, then: (a) in a first example, device A is directly connected to device B; or (b) in a second example, device A is coupled to device B through intervening component C if intervening component C does not alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A semiconductor package, comprising:
    a first die pad having a first top surface and a first bottom surface opposing the first top surface;
    a second die pad in horizontal alignment with the first die pad, the second die pad having a second top surface and a second bottom surface opposing the second top surface, a gap separating the first and second die pads;
    a semiconductor die electrically coupled to the first and second bottom surfaces and extending across the gap, the semiconductor die having a device side including circuitry formed therein, the device side facing away from the first and second die pads;
    a first conductive terminal extending from a lateral surface of the first die pad and away from the first die pad, the first conductive terminal having multiple down-sets;
    a second conductive terminal extending from a lateral surface of the second die pad and away from the second die pad, the second conductive terminal having multiple down-sets;
    a third conductive terminal having fewer down-sets than the first and second conductive terminals and extending from below the first die pad and away from the first die pad;
    a bond wire coupling the device side of the semiconductor die to the third conductive terminal;
    a mold compound covering the semiconductor die and the bond wire, the first and second die pads exposed to an exterior of the mold compound through a top surface of the mold compound; and
    a passive electrical component external to the mold compound and having a first electrical contact coupled to the first die pad and having a second electrical contact coupled to the second die pad,
    wherein the first, second, and third conductive terminals include distal ends that are exposed through a common side surface of the mold compound, the distal ends in horizontal alignment with each other.

2. The semiconductor package of claim 1, wherein the semiconductor package is a quad flat no lead (QFN) type package.

3. The semiconductor package of claim 1, wherein the semiconductor package is a dual flat no lead (DFN) type package.

4. The semiconductor package of claim 1, wherein the semiconductor package is a leaded package selected from the group consisting of small outline transistor (SOT) packages, small outline integrated circuit (SOIC) packages, small outline packages (SOP), dual inline packages (DIP), and quad flat package (QFP) type packages.

5. The semiconductor package of claim 1, further comprising a die attach layer coupling the semiconductor die to the first and second bottom surfaces.

6. The semiconductor package of claim 1, wherein the first and second die pads are electrically conductive.

7. The semiconductor package of claim 1, wherein the first and second top surfaces are approximately flush with the top surface of the mold compound.

8. The semiconductor package of claim 1, wherein the first, second, and third conductive terminals are exposed through a bottom surface of the mold compound that opposes the top surface of the mold compound.

9. The semiconductor package of claim 8, wherein the first, second, and third conductive terminals include cavities that are exposed through the common side surface of the mold compound and that are exposed through the bottom surface of the mold compound.

10. The semiconductor package of claim 1, wherein the bond wire is a first bond wire, and further comprising a second bond wire coupling the device side of the semiconductor die to the first die pad.

11. A quad flat no lead (QFN) semiconductor package, comprising:
- a first die pad;
- a second die pad horizontally aligned with the first die pad, the first and second die pads separated by a gap;
- a first conductive terminal having first and second opposing ends, the first end of the first conductive terminal coupled to the first die pad;
- a second conductive terminal having first and second opposing ends, the first end of the second conductive terminal located vertically lower than the first and second die pads and not vertically overlapping with the first die pad, the second ends of the first and second conductive terminals in horizontal alignment with each other;
- a semiconductor die coupled to at least one of the first and second die pads;
- bond wires coupling the semiconductor die to the second conductive terminal and to at least one of the first and second die pads; and
- a mold compound covering the semiconductor die, the first and second die pads exposed through a top surface of the mold compound, the second ends of the first and second conductive terminals exposed through a side surface of the mold compound.

12. The QFN package of claim 11, wherein the first and second conductive terminals are exposed through a bottom surface of the mold compound.

13. The QFN package of claim 11, further comprising a passive electrical component external to the mold compound and coupled to the first and second die pads.

14. The QFN package of claim 13, wherein the passive electrical component is an inductor or a capacitor.

15. The QFN package of claim 11, wherein the first conductive terminal includes multiple down-sets.

16. The QFN package of claim 11, wherein the second conductive terminal includes a single down-set.

17. A method for manufacturing a semiconductor package, comprising:
- providing a metal structure including:
  - first and second die pads in horizontal alignment and separated by a gap;
  - a first conductive terminal having a first end; and
  - a second conductive terminal having a first end,
  - wherein the first end of the first conductive terminal extends closer to the first die pad in both the horizontal and vertical directions than does the first end of the second conductive terminal;
- coupling a semiconductor die to a bottom surface of the first die pad;
- wirebonding the semiconductor die to the metal structure;
- covering the metal structure and the semiconductor die with a mold compound such that top surfaces of the first and second die pads are exposed through a top surface of the mold compound; and
- cutting the mold compound and the metal structure such that second ends of the first and second conductive terminals are exposed through a side surface of the mold compound that is orthogonal to the top surface of the mold compound, the second ends of the first and second conductive terminals are horizontally aligned with each other and are vertically lower than the first and second die pads.

18. The method of claim 17, wherein the semiconductor package is a quad flat no lead (QFN) type package.

19. The method of claim 17, wherein the first conductive terminal includes multiple down-sets.

20. The method of claim 17, wherein the second conductive terminal includes only one down-set.

21. The method of claim 17, further comprising coupling a passive electrical component to the first and second die pads, the passive electrical component located outside of the mold compound.

22. The method of claim 17, further comprising coupling the semiconductor die to the bottom surface of the second die pad, the semiconductor die coupled to the bottom surfaces of the first and second die pads with a die attach layer, the die attach layer and the semiconductor die extending across the gap.

* * * * *